(12) United States Patent
Shin et al.

(10) Patent No.: US 12,183,727 B2
(45) Date of Patent: Dec. 31, 2024

(54) FLEXIBLE DISPLAY DEVICE

(71) Applicant: LG DISPLAY CO., LTD., Seoul (KR)

(72) Inventors: Insik Shin, Goyang-si (KR); Jongseok Cha, Gyeongsangbuk-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/372,015

(22) Filed: Sep. 22, 2023

(65) Prior Publication Data
US 2024/0014198 A1    Jan. 11, 2024

Related U.S. Application Data

(63) Continuation of application No. 17/117,801, filed on Dec. 10, 2020, now Pat. No. 11,798,928.

(30) Foreign Application Priority Data

Dec. 27, 2019 (KR) ........................ 10-2019-0176808

(51) Int. Cl.
    *H01L 25/18*       (2023.01)
    *H10K 50/844*     (2023.01)
    (Continued)

(52) U.S. Cl.
    CPC ........... *H01L 25/18* (2013.01); *H10K 50/844* (2023.02); *H10K 59/131* (2023.02); *H10K 77/111* (2023.02); *H10K 2102/311* (2023.02)

(58) Field of Classification Search
CPC ..... H01L 25/18; H01L 23/552; H10K 50/844; H10K 50/80; H10K 59/131; H10K 59/12;
(Continued)

(56) References Cited

U.S. PATENT DOCUMENTS

2013/0193415 A1    8/2013    Choi et al.
2016/0155788 A1    6/2016    Kwon et al.
(Continued)

FOREIGN PATENT DOCUMENTS

CN      106449699 A    2/2017
CN      106887186 A    6/2017
(Continued)

OTHER PUBLICATIONS

Office Action issued on Nov. 1, 2023 for corresponding Chinese Patent Application No. 202011410456.7 (with partial English translation).
(Continued)

*Primary Examiner* — Anne M Hines
*Assistant Examiner* — Jose M Diaz
(74) *Attorney, Agent, or Firm* — Morgan, Lewis & Bockius LLP

(57) ABSTRACT

A flexible display device may include a display panel including a display area and a bending area extending from one side of the display area to be bent, a back plate disposed on a rear surface of the display panel, a cushion tape disposed on a rear surface of the back plate, a driver integrated circuit (IC) disposed in a pad portion extending from the bending area, and a functional tape adhered between the cushion tape and the back plate and disposed to face the driver integrated circuit, so that effects capable of improving an EMI shielding function with a low cost, together with an adhesive function, and deriving an optimum efficiency, may be provided.

28 Claims, 13 Drawing Sheets

(51) Int. Cl.
  *H10K 59/131* (2023.01)
  *H10K 77/10* (2023.01)
  *H10K 102/00* (2023.01)

(58) Field of Classification Search
  CPC .............. H10K 59/00; H10K 77/111; H10K 2102/311; G09F 9/301
  See application file for complete search history.

(56) References Cited

U.S. PATENT DOCUMENTS

| | | |
|---|---|---|
| 2017/0047547 A1 | 2/2017 | Son et al. |
| 2017/0179423 A1 | 6/2017 | Kwon et al. |
| 2017/0263891 A1 | 9/2017 | Oh et al. |
| 2018/0083210 A1 | 3/2018 | Choi et al. |
| 2018/0088390 A1 | 3/2018 | Ohara |
| 2018/0151641 A1 | 5/2018 | Choo et al. |
| 2018/0182291 A1 | 6/2018 | Hanari |
| 2018/0217640 A1 | 8/2018 | Nishikawa |
| 2018/0337224 A1 | 11/2018 | Aoki |
| 2018/0374912 A1 | 12/2018 | Zhang et al. |
| 2019/0006444 A1 | 1/2019 | Nishimura et al. |
| 2019/0095007 A1 | 3/2019 | Jeong et al. |
| 2019/0116405 A1 | 4/2019 | Noh et al. |
| 2019/0373719 A1 | 12/2019 | Lee et al. |
| 2019/0380197 A1 | 12/2019 | Lee et al. |
| 2020/0295303 A1* | 9/2020 | Nishimura ......... H10K 50/8445 |

FOREIGN PATENT DOCUMENTS

| | | |
|---|---|---|
| CN | 108054189 A | 5/2018 |
| JP | 2011-118082 A | 6/2011 |
| JP | 2012219208 A | 11/2012 |
| JP | 2013156624 A | 8/2013 |
| JP | 2013-235441 A | 11/2013 |
| JP | 2014056967 A | 3/2014 |
| JP | 2018-054675 A | 4/2018 |
| JP | 2018-085114 A | 5/2018 |
| JP | 2018-109683 A | 7/2018 |
| JP | 2018124327 A | 8/2018 |
| JP | 2018194632 A | 12/2018 |
| JP | 2019012099 A | 1/2019 |
| JP | 2019-035942 A | 3/2019 |
| JP | 2019-061242 A | 4/2019 |
| JP | 2019101262 A | 6/2019 |
| KR | 10-20080032842 A | 4/2008 |
| KR | 10-2018-0058879 A | 6/2018 |
| KR | 10-2019-0035103 A | 4/2019 |
| KR | 10-2019-0060275 A | 6/2019 |
| KR | 10-2019-0139352 A | 12/2019 |
| WO | 2019/111477 A1 | 6/2019 |

OTHER PUBLICATIONS

Office Action issued in corresponding Japanese Patent Application No. 2020-213153, dated Nov. 30, 2021.
Office Action dated Feb. 28, 2023, issued in counterpart Japanese Patent Application No. 2022-066772.
Office Action dated Sep. 2, 2024 issued in corresponding KR Patent Application No. 10-2019-0176808 (with machine translation).

* cited by examiner

FLEXIBLE DISPLAY DEVICE

CROSS-REFERENCE TO RELATED APPLICATIONS

This application is a continuation of U.S. patent application Ser. No. 17/117,801, filed Dec. 10, 2020, which claims the priority to Republic of Korea Patent Application No. 10-2019-0176808 filed on Dec. 27, 2019, with the Korean Intellectual Property Office, the disclosure of which is incorporated by reference in its entirety.

BACKGROUND

Technical Field

The present disclosure relates to a flexible display device and more particularly, to a flexible display device allowing for a reduction in a width of a bezel.

Discussion of the Related Art

As an information age enters, the field of display devices for visually expressing electrical information signals has rapidly advanced. Various display devices, having excellent performance in terms of thinness, weight reduction, and low power consumption, are being developed correspondingly.

Representative display devices may include a liquid crystal display device (LCD), a field emission display device (FED), an electro-wetting display device (EWD), an organic light emitting display device (OLED), and the like.

An electroluminescent display device represented by an organic light emitting display device is a self-light emitting display device, and may be manufactured to be light and thin since it does not require a separate light source, unlike a liquid crystal display device having a separate light source. In addition, the electroluminescent display device has advantages in terms of power consumption due to a low voltage driving, and is excellent in terms of a color implementation, a response speed, a viewing angle, and a contrast ratio (CR). Therefore, electroluminescent display devices are expected to be utilized in various fields.

In the electroluminescent display device, an emissive layer (EML) is disposed between two electrodes formed of an anode and a cathode. When holes from the anode are injected into the emissive layer and electrons from the cathode are injected into the emissive layer, the injected electrons and holes recombine with each other to form excitons in the emissive layer and emit light.

A host material and a dopant material are included in the emissive layer and interact with each other. A host generates excitons from the electrons and holes and transfers energy to a dopant. The dopant is a dye-based organic material that is added in a small amount, and receives the energy from the host to convert it into light.

The electroluminescent display device is encapsulated with glass, metal, or film to block the introduction of moisture or oxygen from the outside to the interior of the electroluminescent display device, thereby preventing oxidation of the emissive layer or the electrode and protecting it from external mechanical or physical impacts.

SUMMARY

As display devices are miniaturized, efforts aimed at reducing a bezel area which is an outer circumferential portion of a display area, in order to increase a size of an effective display screen in the same area of the display device, are continuing.

However, since wirings and a driving circuit for driving the screen are disposed in the bezel area corresponding to a non-display area, there is a limitation in reducing the bezel area.

With regard to a flexible electroluminescent display device capable of maintaining display performance even when bent, by applying a flexible substrate formed of a ductile material such as plastic, there is an effort to reduce a bezel area by bending a non-display area of the flexible substrate, while securing an area for wirings and a driving circuit.

Electroluminescent display devices using a flexible substrate such as plastic or the like need to secure flexibility of various insulating layers disposed on the substrate and wirings formed of a metal material and to prevent defects such as cracks that may be caused by bending.

A protective layer such as a micro-coating layer is disposed over the insulating layers and wirings in a bending area to prevent the occurrence of cracks and protect the wirings from an external foreign material. The protective layer may be coated to have a predetermined thickness and serve to adjust a neutral surface of the bending area.

In the recent electroluminescent display devices for minimizing the bezel area and allowing for a reduction in thickness of the display device, a bending area of a flexible substrate has an extreme curvature and a thickness of the micro-coating layer is minimized.

Meanwhile, an EMI shielding structure is required to block the effect of electro-magnetic interference (EMI) on a driver integrated circuit (IC). However, the related art EMI shielding structures were disadvantageous in that position alignment is inaccurate due to the application of an additional EMI shielding sheet, and costs of components and modules increase due to the use of an expensive material.

Accordingly, the inventors of the present disclosure have recognized the aforementioned problems and have invented a flexible display device capable of shielding EMI and implementing an adhesive function with a low cost by using a functional tape having an EMI shielding structure applied to an existing configuration.

Accordingly, embodiments of the present disclosure are directed to a flexible display device that substantially obviates one or more of the problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a flexible display device comprises a display panel including a display area and a bending area extending from one side of the display area to be bent, a back plate disposed on a rear surface of the display panel, a cushion tape disposed on a rear surface of the back plate, a driver integrated circuit (IC) disposed in a pad portion extending from the bending area, and a functional tape adhered between the cushion tape and the back plate and disposed to face the driver integrated circuit.

In another aspect, a flexible display device comprises a display panel including a first flat portion, a second flat portion facing the first flat portion and including a pad portion, and a curved portion bent between the first flat portion and the second flat portion, a first back plate disposed on a rear surface of the first flat portion, a second back plate disposed on a rear surface of the second flat portion, a cushion tape disposed on a rear surface of the first back plate, a driver integrated circuit disposed on the pad portion, and a functional tape adhered between the cushion tape and the second back plate and disposed to face the driver integrated circuit to thereby shield electro-magnetic interference of the driver integrated circuit.

Specific details of other embodiments are included in the detailed description and drawings.

A flexible display device according to an exemplary embodiment of the present disclosure may provide effects of improving an aesthetic sense by reducing a width of a bezel.

A flexible display device according to another exemplary embodiment of the present disclosure may provide effects capable of improving an EMI shielding function with a low cost, together with an adhesive function, by using a functional tape, and deriving an optimum efficiency.

The effect of the flexible display device according to the exemplary embodiment of the present disclosure is not limited by the contents exemplified above, and more various effects are included in the present disclosure.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
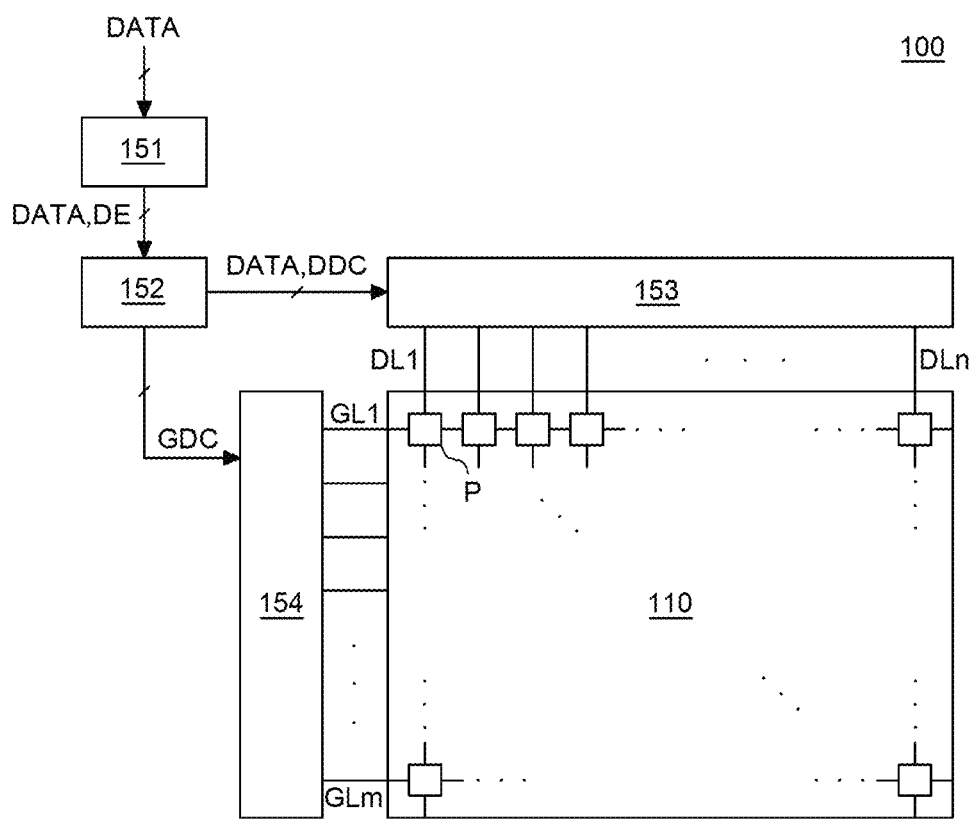
FIG. 1 is a block diagram of a flexible display device according to an exemplary embodiment of the present disclosure.

Advantages and characteristics of the present disclosure and a method of achieving the advantages and characteristics will be clear by referring to the embodiments described below in detail together with the accompanying drawings. However, the present disclosure is not limited to the embodiment disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other elements to be added unless the terms are used with the term "only". Any references to singular may include plural unless expressly stated otherwise.

Elements are interpreted to include an ordinary error range (e.g., a tolerance range) even if not expressly stated.

When the position relation between two elements is described using the terms such as "on", "above", "under", and "next", one or more elements may be positioned between the two parts unless the terms are used with the term "immediately" or "directly".

When an element or a layer is "on" another element or another layer, it may be interpreted as such another element or another layer can be directly on the element or the layer, or the other layer or the other element can be interposed therebetween.

Although the terms "first," "second," and the like are used for describing various elements, these elements are not confined by these terms. These terms are merely used for distinguishing one element from the other elements. Therefore, a first element to be mentioned below may be a second element in a technical concept of the present disclosure.

Like reference numerals refer to like elements throughout the specification.

Area and thickness of each element shown in the figures are merely for illustrative purpose for convenience of description, but are not necessarily limited to the area and thickness of the configuration of the present disclosure as illustrated.

Each of the features of the various embodiments of the present disclosure can be united or combined with each other partly or entirely. The features of the various embodiments can be technically interlocked and driven as well. The features of the various embodiments can be practiced independently or in conjunction with each other.

Hereinafter, various embodiments of the present disclosure will be described in detail with reference to accompanying drawings.

FIG. 1 is a block diagram of a flexible display device according to an exemplary embodiment of the present disclosure.

With reference to FIG. 1, a flexible display device 100 according to an exemplary embodiment of the present disclosure may include an image processing unit 151, a timing controller 152, a data driver 153, a gate driver 154, and a display panel 110.

The image processing unit 151 may output a data signal DATA and a data enable signal DE that are supplied from the outside. The image processing unit 151 may output one or more of a vertical synchronization signal, a horizontal synchronization signal, and a clock signal, in addition to the data enable signal DE.

The timing controller 152 receives the data enable signal DE or the data signal DATA, together with a driving signal including the vertical synchronization signal, the horizontal synchronization signal, the clock signal and the like, from the image processing unit 151. The timing controller 152 may outputs a gate timing control signal GDC for controlling an operational timing of the gate driver 154 and a data timing control signal DDC for controlling an operational timing of the data driver 153 based on the driving signal.

The data driver 153 samples and latches the data signal DATA supplied from the timing controller 152 in response to the data timing control signal DDC supplied from the timing controller 152, and converts the data signal DATA into a gamma reference voltage to output it. The data driver 153 may output the data signal DATA through data lines DL1 to DLn.

The gate driver 154 may output a gate signal while shifting a level of a gate voltage in response to the gate timing control signal GDC supplied from the timing controller 152. The gate driver 154 may output the gate signal through gate lines GL1 to GLm.

The display panel 110 may display an image while a sub-pixel P emits light in response to the data signal DATA and the gate signal supplied from the data driver 153 and the gate driver 154. A detailed structure of the sub-pixel P will be described in detail in FIGS. 2, 4A, and 4B.

Figure 2:
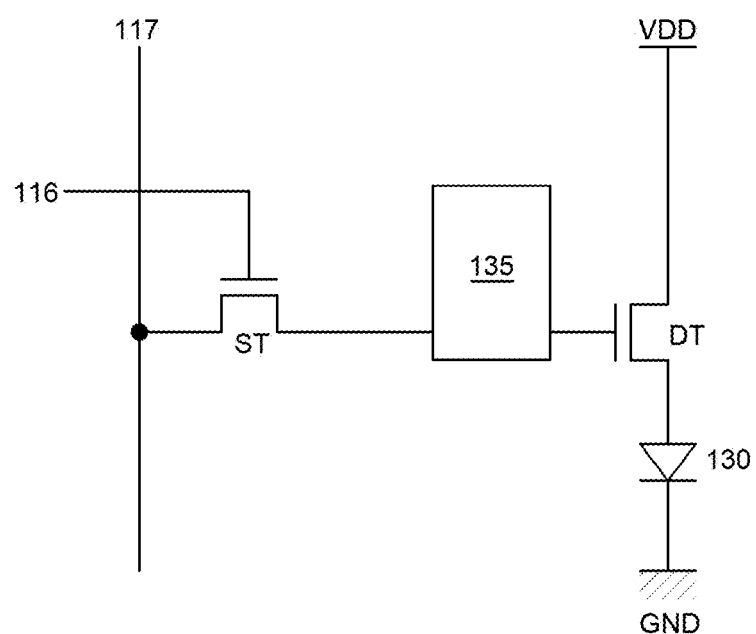
FIG. 2 is a circuit diagram of a sub-pixel included in the flexible display device according to an exemplary embodiment of the present disclosure.

FIG. 2 is a circuit diagram of a sub-pixel included in the flexible display device according to an exemplary embodiment of the present disclosure.

With reference to FIG. 2, the sub-pixel of the flexible display device according to an exemplary embodiment of the present disclosure may include a switching transistor ST, a driving transistor DT, a compensation circuit 135, and a light emitting element 130.

The light emitting element 130 may operate to emit light according to a driving current formed by the driving transistor DT.

The switching transistor ST may perform a switching operation such that a data signal supplied through a data line 117 in response to a gate signal supplied through a gate line 116 is stored as a data voltage in a capacitor.

The driving transistor DT may operate such that a constant driving current flows between a high potential power line VDD and a low potential power line GND in response to the data voltage stored in the capacitor.

The compensation circuit 135 is a circuit for compensating for a threshold voltage or the like of the driving transistor DT, and the compensation circuit 135 may include one or more thin film transistors and capacitors. A configuration of the compensation circuit 135 may vary according to a compensation method.

For example, the sub-pixel shown in FIG. 2 is configured to have a structure of 2T (Transistor)1C (Capacitor) including a switching transistor ST, a driving transistor DT, a capacitor, and a light emitting element 130. However, the sub-pixel may have a variety of structures, such as 3T1C, 4T2C, 6T1C, 6T2C, 7T1C, 7T2C, and the like when the compensation circuit 135 is added thereto.

Figure 3:
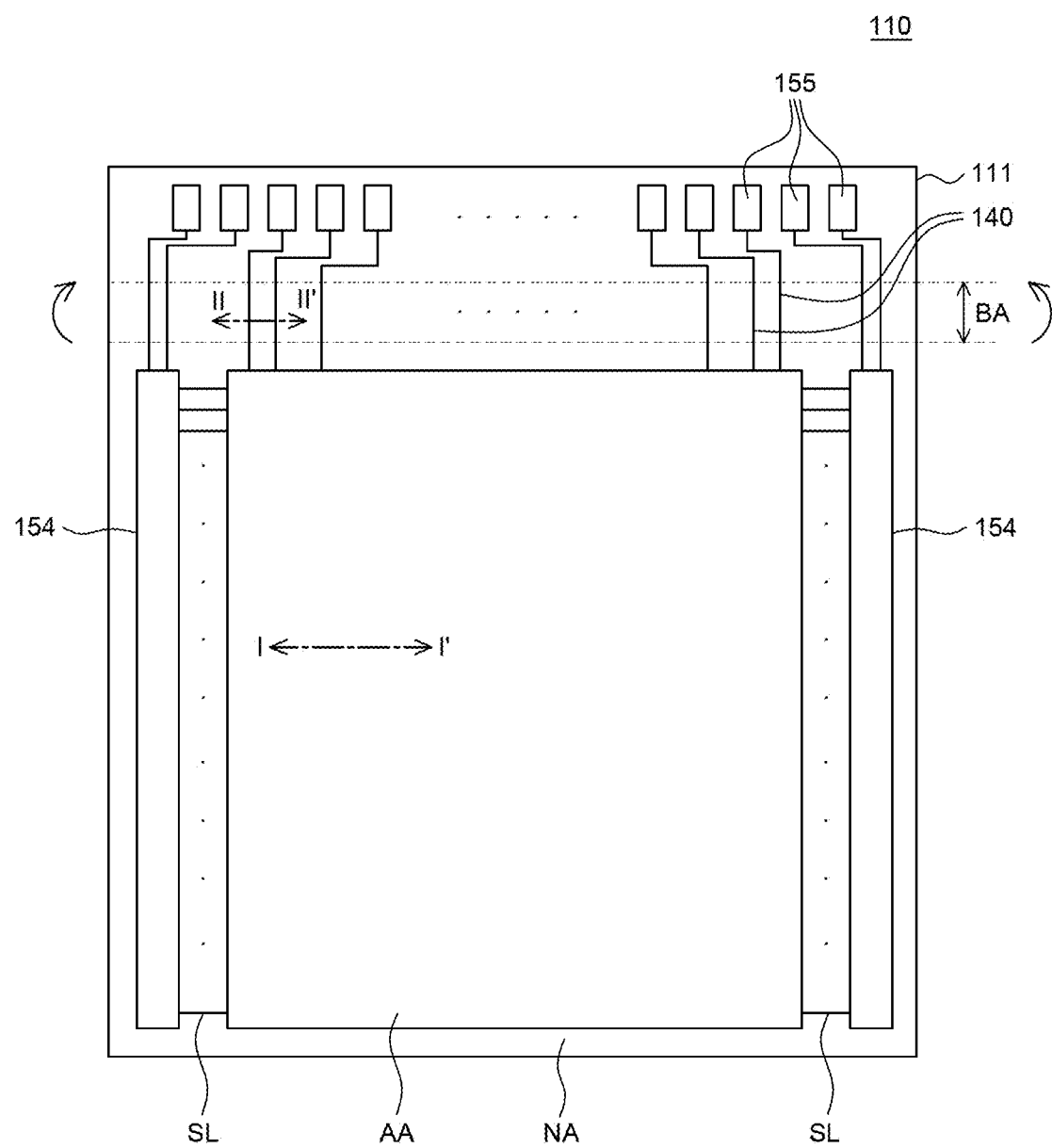
FIG. 3 is a plan view of a flexible display device according to an exemplary embodiment of the present disclosure.

FIG. 3 is a plan view of a flexible display device according to an exemplary embodiment of the present disclosure.

FIG. 3 illustrates, for example, a state in which a flexible substrate 111 of a flexible display device 100 according to an exemplary embodiment of the present disclosure is not bent.

With reference to FIG. 3, the flexible display device 100 may include a display area AA where pixels actually emitting light through a thin film transistor and a light emitting element on the flexible substrate 111 are disposed, and a non-display area NA, which is a bezel area surrounding edges of the display area AA.

A circuit such as a gate driver 154 for driving the flexible display device 100 and various signal wirings such as a scan line (SL) and the like may be disposed in the non-display area NA of the flexible substrate 111.

The circuit for driving the flexible display device 100 may be disposed on the flexible substrate 111 in a gate in panel (GIP) manner, or may be connected to the flexible substrate 111 in a tape carrier package (TCP) or chip on film (COF) manner.

A pad 155 that is a metal pattern is disposed on one side of the flexible substrate 111 in the non-display area NA, so that an external module may be bonded thereto.

A bending area BA may be formed by bending a portion of the non-display area NA of the flexible substrate 111 in a bending direction as indicated by an arrow.

The non-display area NA of the flexible substrate 111 is an area where wirings and driving circuits for driving a screen are disposed. Since the non-display area NA is not an area where an image is displayed, it is unnecessary to be viewed from an upper surface of the flexible substrate 111. Thus, by bending a portion of the non-display area NA of the flexible substrate 111, the bezel area may be reduced, while securing an area for the wirings and driving circuits.

Various wirings may be formed on the flexible substrate 111. The wirings may be formed in the display area AA of the flexible substrate 111, or circuit wirings 140 formed in the non-display area NA may connect the driving circuit or the gate driver, the data driver, and the like to each other to transfer a signal.

The circuit wirings 140 are formed of a conductive material, and may be formed of a conductive material having excellent ductility in order to reduce the occurrence of cracks when the flexible substrate 111 is bent. The circuit wirings 140 may be formed of a conductive material having excellent ductility such as gold (Au), silver (Ag), or aluminum (Al), or may be formed of one of various conductive materials used in the display area AA. The circuit wirings 140 may also be formed of molybdenum (Mo), chromium (Cr), titanium (Ti), nickel (Ni), neodymium (Nd), copper (Cu), or alloys of silver (Ag) and magnesium (Mg).

The circuit wirings 140 may be formed of a multilayer structure including various conductive materials, and may be formed of a three-layer structure of titanium (Ti)/aluminum (Al)/titanium (Ti), but embodiments are not limited thereto.

The circuit wirings 140 formed in the bending area BA receive tensile force when bent. The circuit wirings 140 extending in the same direction as the bending direction on the flexible substrate 111 receive the greatest tensile force, so that cracks or disconnection may occur therein. Therefore, rather than forming the circuit wirings 140 to extend in the bending direction, at least a portion of the circuit wirings 140 disposed in the bending area BA is formed to extend in a diagonal direction, which is a direction different from the bending direction, so that the tensile force may be minimized.

The circuit wiring 140 disposed to be included in the bending area BA may be variously shaped, and may be formed in a shape such as a trapezoidal wave shape, a triangular wave shape, a sawtooth wave shape, a sinusoidal wave shape, an omega (Ω) shape, a rhombus shape, or the like.

Figure 4A:
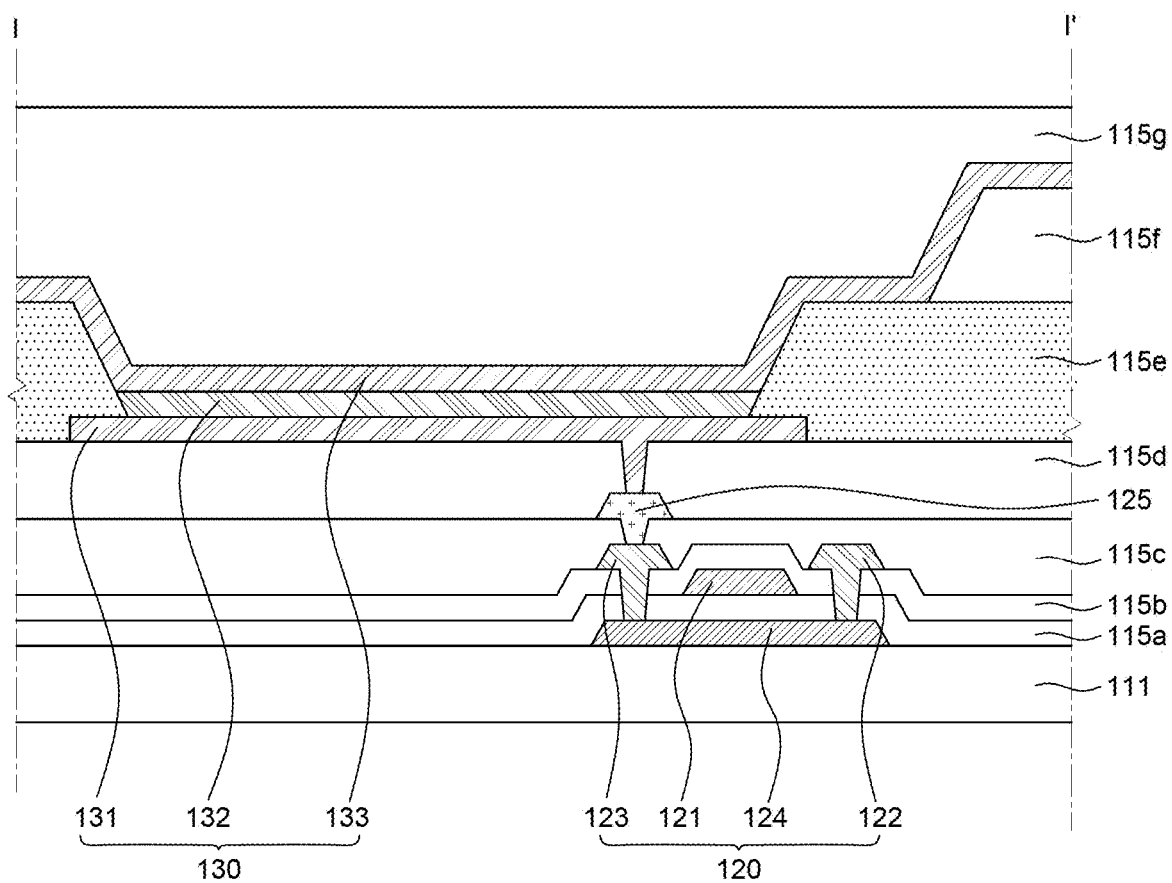
FIG. 4A is a cross-sectional view taken along line I-I' of FIG. 3.

FIG. 4A is a cross-sectional view taken along line I-I' of FIG. 3.

Figure 4B:
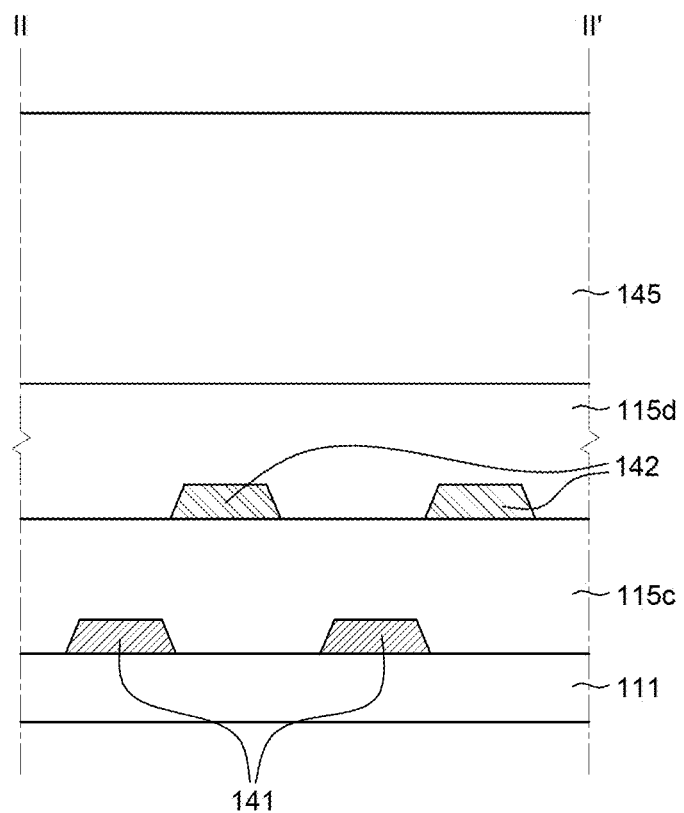
FIG. 4B is a cross-sectional view taken along line II-II' of FIG. 3.

FIG. 4B is a cross-sectional view taken along line II-II' of FIG. 3.

FIG. 4A illustrates a structural cross-section I-I' of the display area AA described in FIG. 3.

With reference to FIG. 4A, the flexible substrate 111 serves to support and protect components of the flexible display device 100 disposed thereon.

Recently, the flexible substrate 111 may be formed of a ductile material having flexible characteristics such as plastic.

The flexible substrate 111 may be in a form of film including one of a polyester-based polymer, a silicone-based polymer, an acrylic-based polymer, a polyolefin-based polymer, and a copolymer thereof.

For example, the flexible substrate 111 may be formed of at least one of polyethylene terephthalate (PET), polybutylene terephthalate (PBT), polysilane, polysiloxane, polysilazane, polycarbosilane, polyacrylate, polymethacrylate, polymethylacrylate, polyethylacrylate, polyethylmethacrylate, a cyclic olefin copolymer (COC), a cyclic olefin polymer (COP), polyethylene (PE), polypropylene (PP), polyimide (PI), polymethylmethacrylate (PMMA), polystyrene (PS), polyacetal (POM), polyether ether ketone (PEEK), polyestersulfone (PES), polytetrafluoroethylene (PTFE), polyvinylchloride (PVC), polycarbonate (PC), polyvinylidenefluoride (PVDF), a perfluoroalkyl polymer (PFA), a styrene acrylonitrile copolymer (SAN), and combinations thereof.

A buffer layer may be further disposed on the flexible substrate 111. The buffer layer prevents penetration of moisture or other impurities from the outside through the flexible substrate 111 and may planarize a surface of the flexible substrate 111. The buffer layer is not a necessary component, and may be deleted depending on a type of a thin film transistor 120 disposed on the flexible substrate 111.

The thin film transistor 120 is disposed on the flexible substrate 111 and may include a gate electrode 121, a source electrode 122, a drain electrode 123 and a semiconductor layer 124.

In this case, the semiconductor layer 124 may be composed of amorphous silicon or polycrystalline silicon, but is not limited thereto. Polycrystalline silicon has superior mobility than amorphous silicon and low energy power consumption and excellent reliability, and thus, may be applied to a driving thin film transistor within the pixel.

The semiconductor layer 124 may be formed of an oxide semiconductor. The oxide semiconductor has excellent mobility and uniformity properties. The oxide semiconductor may be formed of a quaternary metal oxide such as an indium tin gallium zinc oxide (InSnGaZnO)-based material, a ternary metal oxide such as an indium gallium zinc oxide (InGaZnO)-based material, an indium tin zinc oxide (InSnZnO)-based material, an tin gallium zinc oxide (SnGaZnO)-based material, an aluminum gallium zinc oxide (AlGaZnO)-based material, an indium aluminum zinc oxide (InAlZnO)-based material, and a tin aluminum zinc oxide (SnAlZnO)-based material, or a binary metal oxide such as an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium magnesium oxide (InMgO)-based material, an indium gallium oxide (InGaO)-based material, an indium oxide (InO)-based material, a tin oxide (SnO)-based material, and a zinc oxide (ZnO)-based material. Composition ratios of respective elements included in the oxide semiconductor are not limited.

The semiconductor layer 124 may include a source region including a p-type or n-type impurity, a drain region, and a channel region between the source region and the drain region. The semiconductor layer 124 may further include a low concentration doped region between the channel region and adjacent source region or drain region.

The source region and the drain region are doped with a high concentration of impurity, and may be connected to the source electrode 122 and the drain electrode 123 of the thin film transistor 120, respectively.

As an impurity ion, the p-type impurity or n-type impurity may be used. The p-type impurity may be one of boron (B), aluminum (Al), gallium (Ga), and indium (In), and the n-type impurity may be one of phosphorus (P), arsenic (As), and antimony (Sb).

The channel region of the semiconductor layer 124 may be doped with the n-type impurity or p-type impurity according to an NMOS or PMOS thin film transistor structure, and the thin film transistor included in the flexible display device 100 according to an exemplary embodiment of the present disclosure may be an NMOS or PMOS thin film transistor.

A first insulating layer 115a is an insulating layer composed of a single layer of silicon oxide (SiOx) or silicon nitride (SiNx) or multiple layers thereof, and may be disposed such that a current flowing through the semiconductor layer 124 does not flow to the gate electrode 121. In addition, silicon oxide is less ductile than metal, but is superior in ductility to silicon nitride, and may be formed as a single layer or multiple layers depending on characteristics thereof.

The gate electrode 121 serves as a switch for turning on or turning off the thin film transistor 120 based on an electric signal transmitted from the outside through the gate line, and may be composed of a single layer or multiple layers of a conductive metal such as copper (Cu), aluminum (Al), molybdenum (Mo), chromium (Cr), gold (Au), titanium (Ti), nickel (Ni), and neodymium (Nd), or alloys thereof. However, embodiments are not limited thereto.

The source electrode 122 and the drain electrode 123 are connected to the data line, and may enable an electric signal transmitted from the outside to be transmitted from the thin film transistor 120 to the light emitting element 130. The source electrode 122 and the drain electrode 123 may be composed of a single layer or multiple layers of a conductive metal such as copper (Cu), aluminum (Al), molybdenum (Mo), chromium (Cr), gold (Au), titanium (Ti), nickel (Ni), and neodymium (Nd), or alloys thereof, but are not limited thereto.

To insulate the gate electrode 121 and the source electrode 122 and the drain electrode 123 from each other, a second insulating layer 115b composed of a single layer or multiple layers of silicon oxide (SiOx) or silicon nitride (SiNx) may be disposed between the gate electrode 121 and the source electrode 122 and the drain electrode 123.

A passivation layer formed of an inorganic insulating layer such as silicon oxide (SiOx) or silicon nitride (SiNx) may be disposed on the thin film transistor 120.

The passivation layer may prevent unnecessary electrical connections between components disposed over and under the passivation layer and prevent contamination or damage from the outside. The passivation layer may be omitted depending on configurations and characteristics of the thin film transistor 120 and the light emitting element 130.

Structures of the thin film transistor 120 may be divided into an inverted-staggered structure and a coplanar structure according to positions of elements constituting the thin film transistor 120. For example, the thin film transistor having an inverted-staggered structure refers to a thin film transistor having a structure in which a gate electrode is positioned opposite to a source electrode and a drain electrode based on the semiconductor layer 124. As in FIG. 4A, the thin film transistor 120 having a coplanar structure refers to a thin film transistor having a structure in which the gate electrode 121 is positioned on the same side as the source electrode 122 and the drain electrode 123 based on the semiconductor layer 124.

In FIG. 4A, the thin film transistor 120 having a coplanar structure is illustrated, but the flexible display device 100 according to an exemplary embodiment of the present disclosure may also include a thin film transistor having an inverted-staggered structure.

For convenience of description, only a driving thin film transistor is illustrated among various thin film transistors that may be included in the flexible display device 100. And, a switching thin film transistor, a capacitor, or the like may also be included in the flexible display device 100.

In addition, when a signal is applied from the gate line to the switching thin film transistor, the switching thin film transistor transmits the signal from the data line to a gate electrode of the driving thin film transistor. The driving thin film transistor may transmit a current transferred through power wirings to an anode 131 by the signal transmitted from the switching thin film transistor, and control light emission by the current transmitted to the anode 131.

Planarization layers 115c and 115d may be disposed on the thin film transistor 120 to protect the thin film transistor 120, to alleviate a step caused by the thin film transistor 120, and to reduce parasitic capacitance generated between the thin film transistor 120 and the gate line and the data line, and the light emitting elements 130.

The planarization layers 115c and 115d may be formed of one or more of acrylic resin, epoxy resin, phenolic resin, polyamides resin, polyimides resin, unsaturated polyesters resin, polyphenylene resin, polyphenylene sulfides resin and benzocyclobutene, but is not limited thereto.

The flexible display device 100 according to an exemplary embodiment of the present disclosure may include a first planarization layer 115c and a second planarization layer 115d that are sequentially stacked. That is, the first planarization layer 115c may be disposed on the thin film transistor 120 and the second planarization layer 115d may be disposed on the first planarization layer 115c.

A buffer layer may be disposed on the first planarization layer 115c. The buffer layer may be composed of multiple layers of silicon oxide (SiOx) to protect components disposed on the first planarization layer 115c, and may be omitted depending on configurations and characteristics of the thin film transistor 120 and the light emitting element 130.

An intermediate electrode 125 may be connected to the thin film transistor 120 through a contact hole formed in the first planarization layer 115c. The intermediate electrode 125 is stacked so as to be connected to the thin film transistor 120, and the data line may also be formed in a multilayer structure.

The data line may be formed to have a structure in which a lower layer formed of the same material as the source electrode 122 and the drain electrode 123 and an upper layer formed of the same material as the intermediate electrode 125 are connected to each other. That is, the data line may be implemented in a structure in which two layers are connected in parallel to each other, and in this case, wiring resistance of the data line may be reduced.

Meanwhile, a passivation layer formed of an inorganic insulating layer such as silicon oxide (SiOx) or silicon nitride (SiNx) may be further disposed on the first planarization layer 115c and the intermediate electrode 125. The passivation layer may serve to prevent unnecessary electrical connections between components and to prevent contamination or damage from the outside, and may be omitted depending on configurations and characteristics of the thin film transistor 120 and the light emitting element 130.

The light emitting element 130 disposed on the second planarization layer 115d may include the anode 131, a light emitting unit 132, and a cathode 133.

The anode 131 may be disposed on the second planarization layer 115d.

The anode 131 serves to supply holes to the light emitting unit 132 and is connected to an intermediate electrode 125 through a contact hole in the second planarization layer 115d to thereby be electrically connected to the thin film transistor 120.

The anode 131 may be formed of a transparent conductive material, such as indium tin oxide (ITO), indium zinc oxide (IZO), or the like, but is not limited thereto.

When the flexible display device 100 is a top emission type display device that emits light to an upper portion thereof where the cathode 133 is disposed, it may further include a reflective layer such that the emitted light is reflected from the anode 131 to be smoothly emitted in a direction toward the upper portion where the cathode 133 is disposed.

The anode 131 may be a two-layer structure in which a transparent conductive layer formed of a transparent conductive material and a reflective layer are sequentially stacked, or a three-layer structure in which a transparent conductive layer, a reflective layer and a transparent conductive layer are sequentially stacked. The reflective layer may be formed of silver (Ag) or an alloy including silver.

A bank 115e disposed on the anode 131 and the second planarization layer 115d may define the sub-pixel by dividing areas that actually emits light. After forming a photoresist on the anode 131, the bank 115e may be formed by photolithography. Photoresist refers to a photosensitive resin whose solubility in a developer is changed by the action of light, and a specific pattern may be obtained by exposing and developing the photoresist. Types of photoresist may be classified into a positive photoresist and a negative photoresist. The positive photoresist is a photoresist whose solubility of the exposed portion in the developer is increased by the exposure. When the positive photoresist is developed, a pattern from which exposed portions are removed is obtained. The negative photoresist is a photoresist whose solubility of the exposed portion in the developer is significantly lowered by the exposure. When the negative photoresist is developed, a pattern from which non-exposed portions are removed is obtained.

A FMM (Fine Metal Mask) which is a deposition mask, may be used to form the light emitting unit 132 of the light emitting element 130.

In addition, to prevent damage that may occur due to contact with the deposition mask disposed on the bank 115e and to maintain a constant distance between the bank 115e and the deposition mask, a spacer 115f formed of one of polyimide which is a transparent organic material, photo acryl, and benzocyclobutene (BCB) may be disposed on the bank 115e.

The light emitting unit 132 may be disposed between the anode 131 and the cathode 133.

The light emitting unit 132 serves to emit light and may include at least one of a hole injection layer (HIL), a hole transport layer (HTL), a light emitting layer, an electron transport layer (ETL), and an electron injection layer (EIL), and some components may be omitted depending on a structure or characteristics of the flexible display device 100. Here, an electroluminescent layer or an inorganic emitting layer may be applied to the light emitting layer.

The hole injection layer is disposed on the anode 131 to facilitate an injection of holes.

The hole transport layer is disposed on the hole injection layer to smoothly transport holes to the light emitting layer.

The light emitting layer is disposed on the hole transport layer and may include a material capable of emitting light of a specific color to thereby emit light of a specific color. In addition, a luminescent material may be formed using a phosphorescent material or a fluorescent material.

The electron injection layer may be further disposed on the electron transport layer. The electron injection layer is an organic layer that facilitates an injection of electrons from the cathode 133 and may be omitted depending on the structure and characteristics of the flexible display device 100.

On the other hand, at a position adjacent to the light emitting layer, an electron blocking layer or a hole blocking layer that blocks a flow of electrons or holes is further disposed to thereby prevent a phenomenon in which when electrons are injected into the light emitting layer, the electrons move from the light emitting layer and pass to the adjacent hole transport layer or a phenomenon in which when holes are injected into the light emitting layer, the holes move from the light emitting layer and pass to the adjacent electron transport layer, so that luminous efficiency may be improved.

The cathode 133 is disposed on the light emitting unit 132 and serves to supply electrons to the light emitting unit 132. Since the cathode 133 needs to supply electrons, it may be formed of a metal material such as magnesium (Mg), silver-magnesium, which is a conductive material having a low work function, and is not limited thereto.

When the flexible display device 100 is a top emission type display device, the cathode 133 may be a transparent conductive oxide such as indium tin oxide (ITO), indium zinc oxide (IZO), indium tin zinc oxide (ITZO), zinc oxide (ZnO), and tin oxide (TO).

An encapsulation part 115g may be disposed on the light emitting element 130 to prevent the thin film transistor 120 and the light emitting element 130, which are components of the flexible display device 100, from being oxidized or damaged due to moisture, oxygen, or impurities introduced from the outside. The encapsulation part 115g may be formed by stacking a plurality of encapsulation layers, a foreign material compensation layer, and a plurality of barrier films.

The encapsulation layer may be disposed on the entire surface of an upper portion of the thin film transistor 120 and the light emitting element 130, and may be formed of one of silicon nitride (SiNx) or aluminum oxide (AlyOz) which is an inorganic material. However, embodiments are not limited thereto. An encapsulation layer may be further disposed on the foreign material compensation layer disposed on another encapsulation layer.

The foreign material compensation layer is disposed on the encapsulation layer, and an organic material such as silicon oxycarbon (SiOCz), acrylic (acryl), or epoxy-based resin may be used for the foreign material compensation layer. However, embodiments are not limited thereto. When a defect occurs due to a crack generated by a foreign material or particles that may be generated during a process, it may be compensated for by covering a curve and a foreign material by the foreign material compensation layer.

A barrier film may be disposed on the encapsulation layer and the foreign material compensation layer, whereby the flexible display device 100 may delay the penetration of oxygen and moisture from the outside. The barrier film is configured in the form of a light-transmissive and double-sided adhesive film, and may be composed of any one of olefin-based, acrylic-based, and silicon-based insulating materials. Alternatively, a barrier film composed of any one of COP (cycloolefin polymer), COC (cycloolefin copolymer) and PC (Polycarbonate) may be further stacked, but is not limited thereto.

FIG. 4B illustrates a structural cross-section II-II' of a bending area described in FIG. 3.

Some components of FIG. 4B are substantially the same as or similar to those described in FIG. 4A, and thus, descriptions thereof will be omitted.

The gate signal and the data signal described with reference to FIGS. 1 to 3 are transmitted from the outside to the pixels disposed in the display area AA through the circuit wirings disposed in the non-display area NA of the flexible display device 100, thereby allowing for light emission.

When the wirings disposed in the non-display area NA including the bending area BA of the flexible display device 100 is formed in a single layer structure, a large amount of space for disposing the wirings therein is required. After depositing a conductive material, the conductive material is patterned to have a desired wiring shape by a process such as an etching process or the like. However, there is a limitation in fineness of the etching process, and thus, a lot of space is required due to a limit to narrowing a gap between the wirings. Consequently, the area of the non-display area NA increases, which may cause difficulty in implementing a narrow bezel.

In addition, in a case in which one wiring is used to transmit one signal, when a corresponding wiring cracks, a corresponding signal may not be transmitted.

In a process of bending the substrate 111, cracks may occur in the wiring itself, or cracks may occur in other layers and propagate to the wiring. In this manner, when a crack occurs in the wiring, a signal to be transmitted may not be transmitted.

Accordingly, the wiring disposed in the bending area BA of the flexible display device 100 according to the exemplary embodiment of the present disclosure may be disposed as a double wiring of a first wiring 141 and a second wiring 142.

The first wiring 141 and the second wiring 142 are formed of a conductive material, and may be formed of a conductive material having excellent ductility in order to reduce the occurrence of cracks when bending the flexible substrate 111.

The first wiring 141 and the second wiring 142 may be formed of a conductive material having excellent ductility, such as gold (Au), silver (Ag), or aluminum (Al). The first wiring 141 and the second wiring 142 may be formed of one of various conductive materials used in the display area AA, and may be formed of molybdenum (Mo), chromium (Cr), titanium (Ti), nickel (Ni), neodymium (Nd), copper (Cu), or an alloy of silver (Ag) and magnesium (Mg). In addition, the first wiring 141 and the second wiring 142 may be formed of a multilayer structure including various conductive materials, and may be formed of a three-layer structure of titanium (Ti)/aluminum (Al)/titanium (Ti). However, embodiments of the present disclosure are not limited thereto.

To protect the first wiring 141 and the second wiring 142, a buffer layer formed of an inorganic insulating layer may be disposed under the first wiring 141 and the second wiring 142. A passivation layer formed of an inorganic insulating layer is formed to surround upper and side portions of the first wiring 141 and the second wiring 142, thereby preventing a phenomenon in which the first wiring 141 and the second wiring 142 react with moisture or the like and are corroded.

The first wiring 141 and the second wiring 142 formed in the bending area BA receive tensile force when bent. As described in FIG. 3, the wirings extending on the substrate 111 in the same direction as a bending direction receive the greatest tensile force, and a crack may occur therein. If the crack is severe, disconnection may occur. Therefore, rather than forming the wirings to extend in the bending direction, at least a portion of the wirings disposed in the bending area BA is formed to extend in a diagonal direction, which is a direction different from the bending direction, so that the tensile force may be minimized to reduce the occurrence of cracks. The wiring may be formed in a shape such as a rhombus shape, a triangular wave shape, a sinusoidal wave shape. A trapezoidal wave shape or the like, but is not limited thereto.

The first wiring 141 may be disposed on the substrate 111 and the first planarization layer 115c may be disposed on the first wiring 141. The second wiring 142 may be disposed on the first planarization layer 115c, and the second planarization layer 115d may be disposed on the second wiring 142. The first planarization layer 115c and the second planarization layer 115d may be formed of one or more of acrylic resin, epoxy resin, phenolic resin, polyamides resin, polyimides resin, unsaturated polyesters resin, polyphenylene resin, polyphenylene sulfides resin, and benzocyclobutene, but is not limited thereto.

A micro-coating layer 145 may be disposed on the second planarization layer 115d.

Since tensile force is applied to a wiring portion disposed on the substrate 111 when the substrate is bent to thereby occur cracks in the wirings, the micro-coating layer 145 may serve to protect the wirings by coating resin with a small thickness at a bending position.

Figure 5:
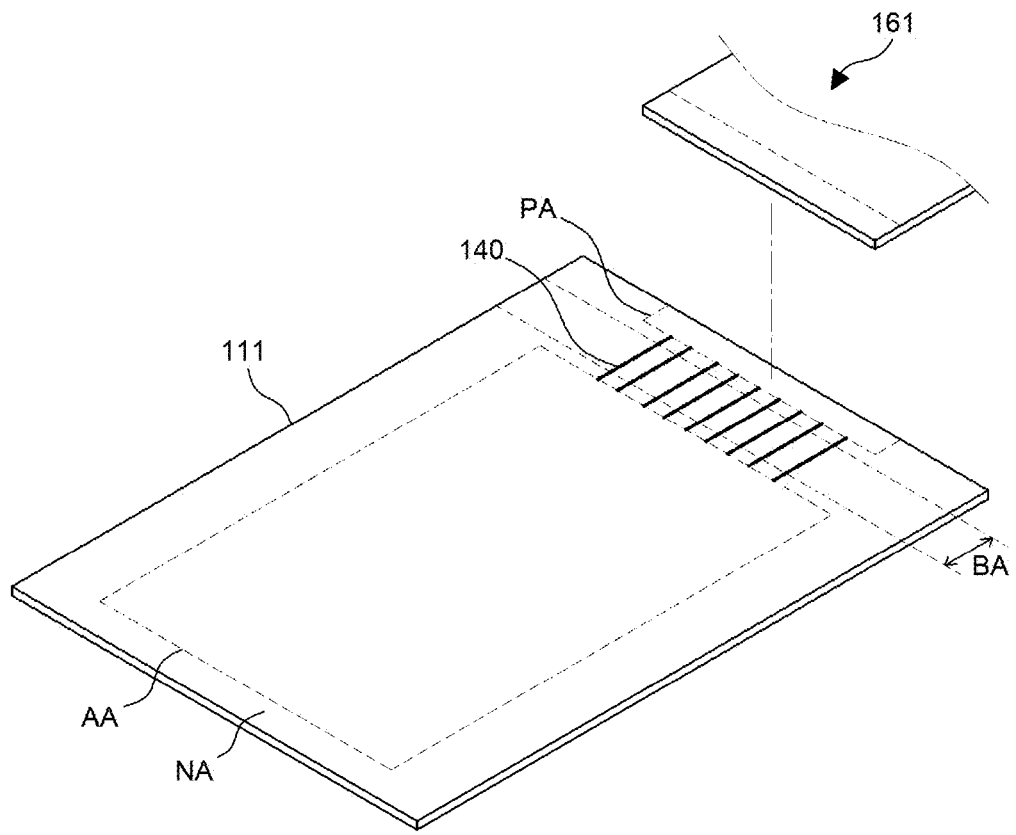
FIG. 5 is a perspective view of the flexible display device according to an exemplary embodiment of the present disclosure.

FIG. 5 is a perspective view of the flexible display device according to an exemplary embodiment of the present disclosure.

Figure 6:
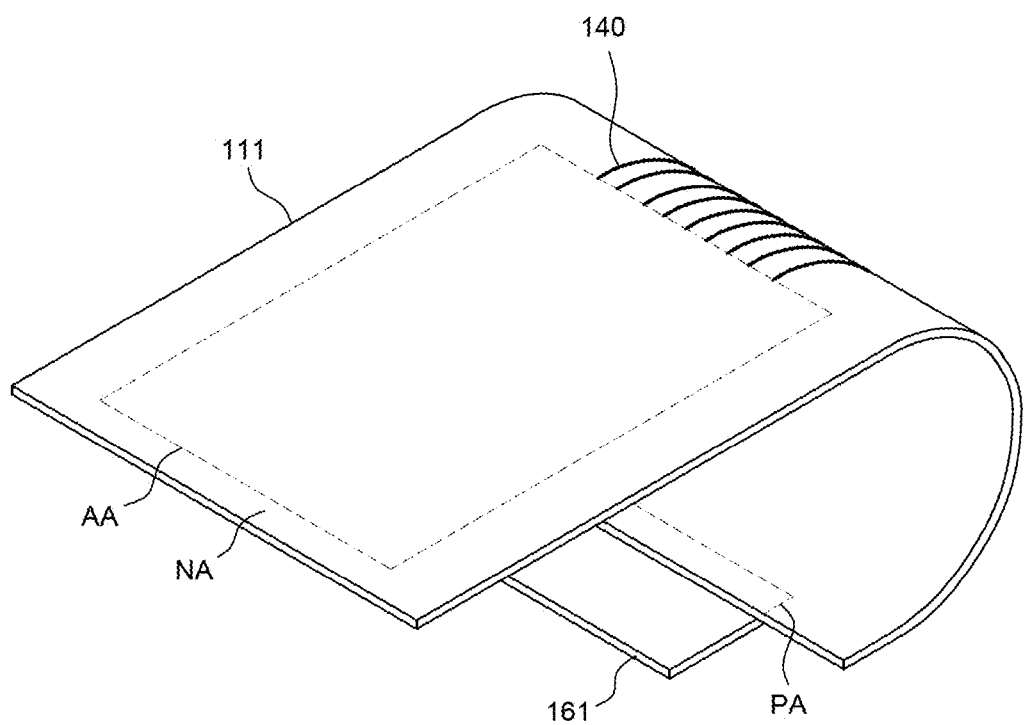
FIG. 6 is a perspective view illustrating a bending state of the flexible display device according to an exemplary embodiment of the present disclosure.

FIG. 6 is a perspective view illustrating a bending state of the flexible display device according to an exemplary embodiment of the present disclosure FIGS. 5 and 6 illustrates a case where one side of the flexible display device, for example, a lower portion of the flexible display device is bent.

With reference to FIG. 5, the flexible display device 100 according to an exemplary embodiment of the present disclosure may include the substrate 111 and a circuit element 161.

The substrate 111 may be divided into a display area AA and a non-display area NA which is a bezel area surrounding an edge of the display area AA.

The non-display area NA may include a pad portion PA defined outside the display area AA. A plurality of sub-pixels may be disposed in the display area AA. The sub-pixels may be arranged in a manner of R (red), G (green), and B (blue), or in a manner of R, G, B, and W (white) in the display area AA to thereby realize a full color. The sub-pixels may be divided by gate lines and data lines that intersect each other.

The circuit element 161 may include bumps (or terminals). The bumps of the circuit element 161 may be respectively bonded to pads of the pad portion PA through anisotropic conductive films. The circuit element 161 may be a chip on film (COF) in which a driver IC (Integrated Circuit) is mounted on a flexible film. In addition, the circuit element 161 may be implemented as a chip on glass (COG) type in which it is directly bonded to pads on a substrate by a COG process. Further, the circuit element 161 may be a flexible circuit such as a flexible flat cable (FFC) or a flexible printed circuit (FPC). In the following embodiments, the COF is mainly described as an example of the circuit element 161, but the present disclosure is not limited thereto.

The driving signals supplied through the circuit element 161, for example, a gate signal and a data signal may be supplied to the gate line and the data line of the display area AA through the circuit wirings 140 such as routing lines.

In the flexible display device 100, a sufficient space in which the pad portion PA, the circuit element 161, and the like may be positioned should be secured, in addition to the display area AA where an input image is implemented. Such a space corresponds to a bezel area, and the bezel area may be recognized by a user positioned in the front of the flexible display device 100 and may be a factor in lowering aesthetics.

With reference to FIG. 6, the flexible display device 100 according to an exemplary embodiment of the present disclosure may be bent in a rear direction such that a lower edge of the substrate 111 has a predetermined curvature.

The lower edge of the substrate 111 may correspond to an outside portion of the display area AA, and may correspond to an area where the pad portion PA is positioned. As the substrate 111 is bent, the pad portion PA may be positioned to overlap the display area AA in the rear direction of the display area AA. Accordingly, a bezel area recognized from the front surface of the flexible display device 100 may be reduced. Accordingly, a bezel width is reduced to thereby provide an effect of improving an aesthetic sense.

To this end, the substrate 111 may be formed of a flexible, bendable material. For example, the substrate 111 may be formed of a plastic material such as polyimide (PI). In addition, the circuit wiring 140 may be formed of a material having flexibility. For example, the circuit wiring 140 may be formed of a material such as a metal nano wire, metal mesh, or carbon nanotube (CNT). However, embodiments are not limited thereto.

The circuit wirings 140 may extend from the display area AA and be disposed in the bending area BA. That is, the circuit wiring 140 may extend along an outer circumferential surface of the substrate 111 in the bending area BA.

Meanwhile, an electro-magnetic interference (EMI) shielding structure is required to block an effect of EMI on the driver IC. However, the prior art EMI shielding structures were disadvantageous in that position alignment is inaccurate due to the application of an additional EMI shielding sheet, and costs of components and modules increase due to the use of an expensive material.

Accordingly, the flexible display device 100 according to an exemplary embodiment of the present disclosure is capable of shielding EMI, simultaneously with implementing an adhesive function with a low cost by using a functional tape in which an EMI shielding sheet is added to a conventional adhesive tape.

Figure 7:
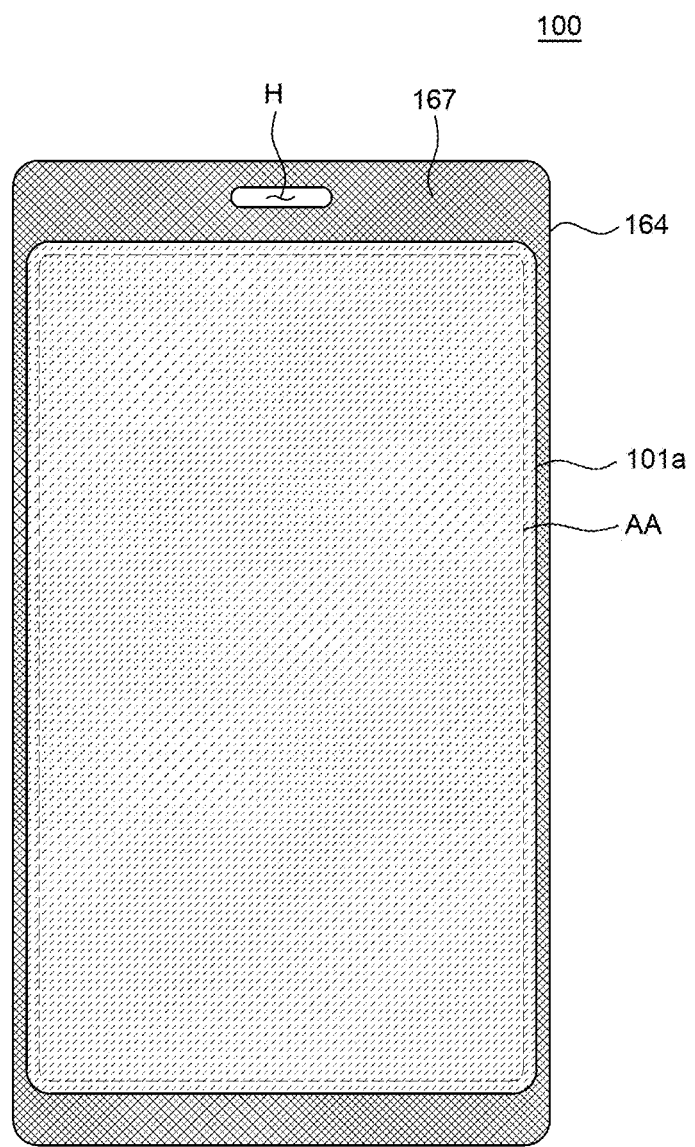
FIG. 7 is a plan view of the flexible display device with a hole H formed in an upper portion thereof according to an exemplary embodiment of the present disclosure.

FIG. 7 is a plan view of the flexible display device with a hole H formed in an upper portion thereof according to an exemplary embodiment of the present disclosure.

Figure 8:
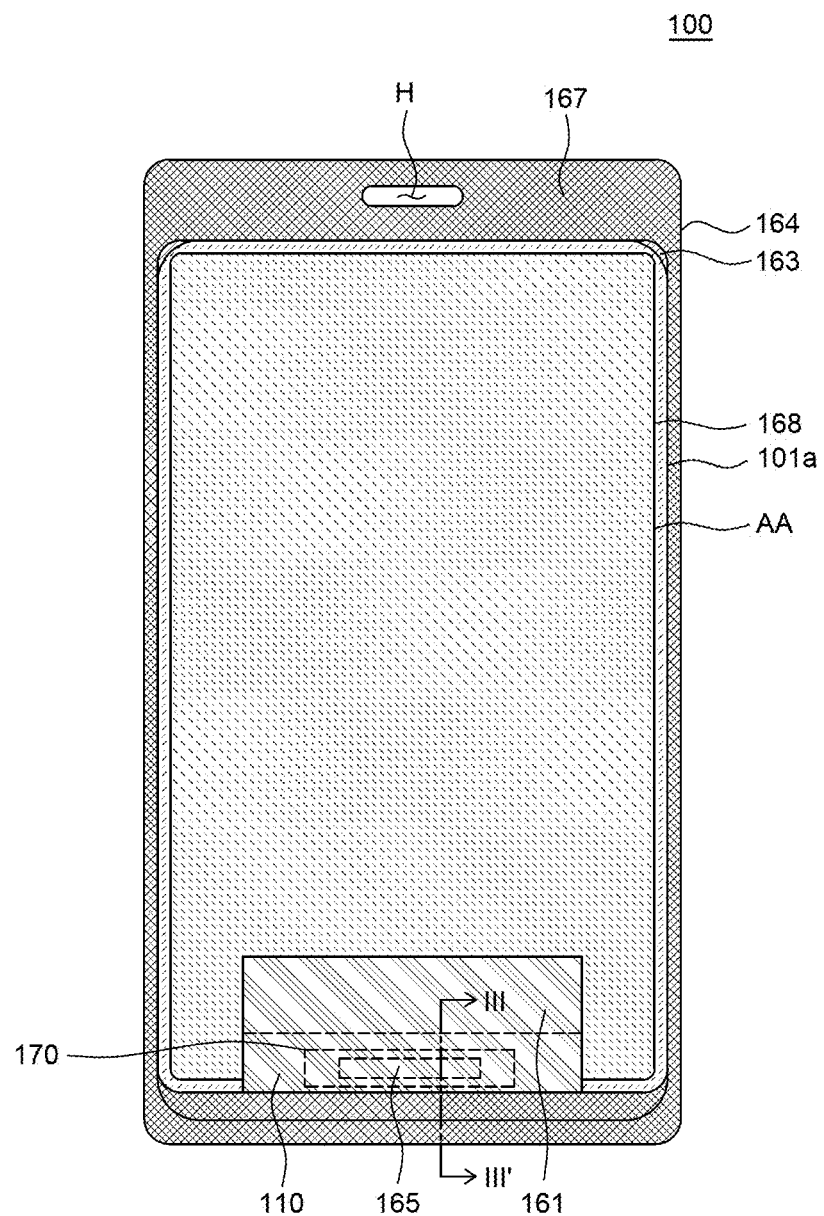
FIG. 8 is a rear view of the flexible display device with a hole H formed in an upper portion thereof according to an exemplary embodiment of the present disclosure.

FIG. 8 is a rear view of the flexible display device with a hole H formed in an upper portion thereof according to an exemplary embodiment of the present disclosure.

Figure 9:
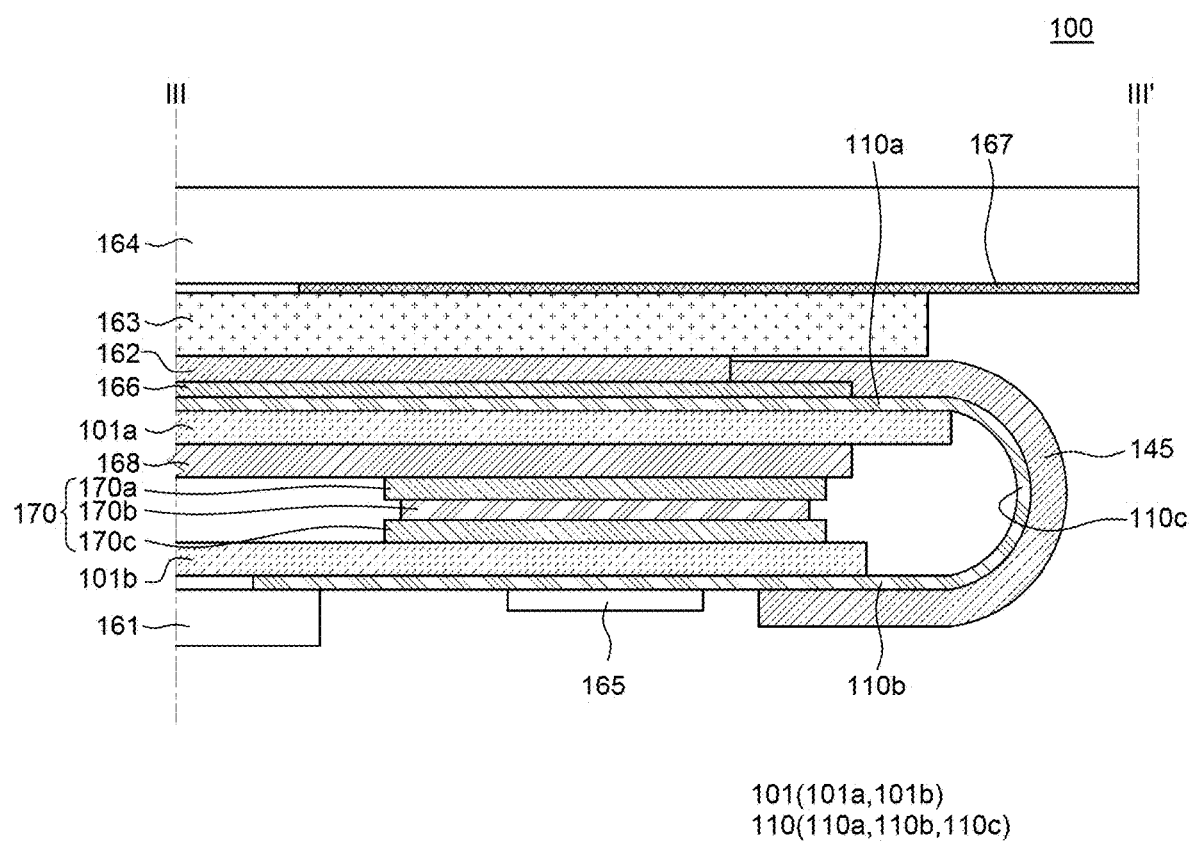
FIG. 9 is a cross-sectional view taken along line III-III' of FIG. 8.

FIG. 9 is a cross-sectional view taken along line III-III' of FIG. 8.

Figure 10A:
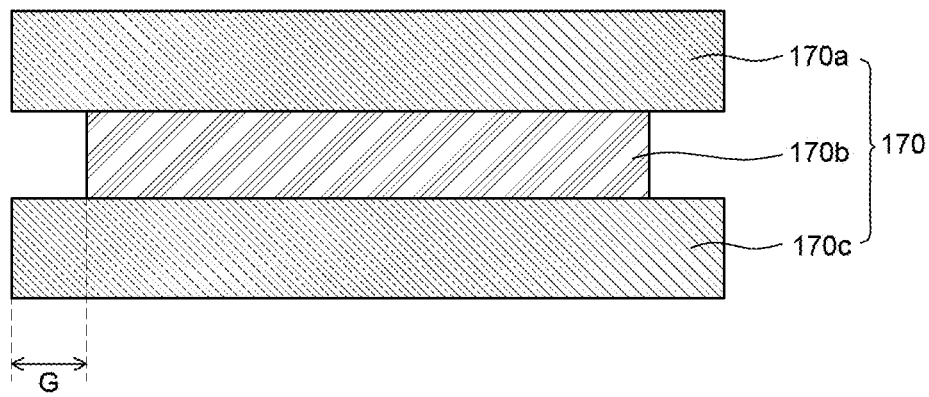
FIGS. 10A and 10B are a cross-sectional view and a plan view of a functional tape.
Figure 10B:
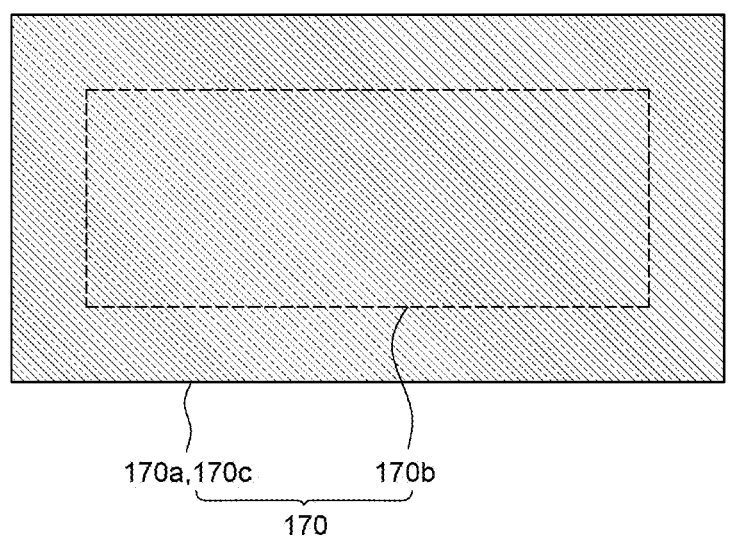

FIGS. 10A and 10B are a cross-sectional view and a plan view of a functional tape.

FIG. 9 illustrates a cross-section of a lower portion of the flexible display device 100 according to an exemplary embodiment of the present disclosure, as an example.

FIGS. 7 to 9 each illustrates an example in which a hole H for a camera, an optical sensor, a receiver, or a fingerprint sensor is formed in an upper portion of the flexible display device 100, but is not limited thereto.

With reference to FIGS. 7 to 9, the flexible display device 100 according to an exemplary embodiment of the present disclosure includes a display panel 110, a back plate 101, a polarizing plate 162, and a cover glass 164.

With reference to FIG. 9, the display panel 110 includes a first flat portion 110a and a second flat portion 110b, and a curved portion positioned between the first flat portion 110a and the second flat portion 110b. The first flat portion 110a corresponds to the display area AA having a plurality of sub-pixels, and is an area maintained in a flat state. The second flat portion 110b is an area facing the first flat portion 110a, and corresponds to the pad portion having pads bonded to the circuit element 161. The second flat portion 110b is an area maintained in a flat state. The curved portion 110c is an area in which circuit wirings connecting the display area AA and the pad portion to each other are provided, and is an area maintained in a bending state with a predetermined curvature.

For example, the curved portion 110c may have a "D" shape. That is, the curved portion 110c extends from the first flat portion 110a and bends at an angle of approximately 180 degrees in a rear direction. Accordingly, the second flat portion 110b extending from the curved portion 110c may be positioned to overlap the first plane portion 110a in the rear of the first plane portion 110a. The circuit element 161 bonded to the second flat portion 110b of the display panel 110 may be positioned in the rear of the first flat portion 110a of the display panel 110.

Although not illustrated, a barrier film may be disposed on the display panel 110.

The barrier film is a component for protecting various components of the display panel 110 and may be disposed to correspond to at least the display area AA of the display panel 110. The barrier film is not necessarily required, and may be deleted depending on a structure of the flexible display device 100. The barrier film may be composed of an adhesive material. The adhesive material may be a thermo-setting or self-curing adhesive and may be formed of a material such as pressure sensitive adhesive (PSA), and thus, it may serve to fix the polarizing plate 162 on the barrier film thereto.

The polarizing plate 162 disposed on the barrier film may suppress reflection of external light on the display area AA. When the display device 100 is externally used, external natural light may be introduced and reflected by a reflective layer included in the anode of an electroluminescent element, or reflected by an electrode formed of metal disposed under the electroluminescent element. An image of the display device 100 may not be recognized well by the reflected light. The polarizing plate 162 polarizes light introduced from the outside in a specific direction, and prevents reflected light from being emitted to the outside of the display device 100 again. The polarizing plate 162 may be disposed on the display area AA, but is not limited thereto.

The polarizing plate 162 may be a polarizing plate composed of a polarizer and a protective film protecting the polarizer, or may be formed by coating a polarizing material for flexibility.

A touch panel 166 may be disposed between the polarizing plate 162 and the display panel 110, but is not limited thereto.

The touch panel 166 may include a plurality of touch sensors. The touch sensor may be disposed at a position corresponding to the display area AA of the display panel 110. The touch sensor may include at least one of a mutual capacitance sensor and a self-capacitance sensor.

The mutual capacitance sensor includes a mutual capacitance formed between two touch electrodes. A mutual capacitance sensing circuit may apply a driving signal (or a stimulus signal) to any one of the two electrodes and sense a touch input based on variance of electric charges in the mutual capacitance through the other electrode. When a conductor approaches the mutual capacitance, the amount of electric charges in the mutual capacitance decreases, so that a touch input or gesture can be detected.

A self-capacitance sensor includes a self-capacitance formed in each of sensor electrodes. A self-capacitance sensing circuit can supply an electric charge to each sensor electrode and sense a touch input based on variance of electric charges in the self-capacitance. When a conductor approaches the self-capacitance, capacitance of the sensor is connected in parallel to capacitance of the conductor, thereby increasing a capacitance value. Therefore, in the case of a self-capacitance, when a touch input is sensed, a capacitance value of the sensor increases.

A structure in which the touch panel 166 is positioned on the display panel 110 is called a touch on encapsulation (TOE) structure, but is not limited thereto.

With reference to FIGS. 7 to 9, an adhesive layer 163 may be disposed on the polarizing plate 162, whereby a cover glass 164 for protecting the exterior of the display device 100 may adhere to and disposed on the polarizing plate 162. The cover glass 164 may be provided to cover the entire surface of the display panel 110 and serve to protect the display panel 110.

The adhesive layer 163 may include an optically clear adhesive (OCA).

A light blocking pattern 167 may be disposed on four edges of the cover glass 164.

The light blocking pattern 167 may be disposed on edges of a rear surface of the cover glass 164.

The light blocking pattern 167 may be disposed to overlap the adhesive layer 163, the polarizing plate 162, and a portion of the display panel 110 that are disposed under the light blocking pattern 167.

The light blocking pattern 167 may be applied with black ink.

A plurality of holes (or openings) H may be provided in an upper portion of the display device 100. For example, the holes H may include an optical sensor hole, a receiver hole, a camera hole, or a fingerprint sensor hole (or a home button hole).

The back plate 101 may be disposed on a rear surface of the display panel 110. When a substrate of the display panel 110 is formed of a plastic material such as polyimide, a manufacturing process of the flexible display device 100 is conducted in a situation in which a support substrate formed of glass is disposed under the display panel 110. After the manufacturing process is completed, the support substrate may be separated and released.

Since a component for supporting the display panel 110 is required even after the support substrate is released, the back plate 101 for supporting the display panel 110 may be disposed on the rear surface of the display panel 110.

The back plate 101 may prevent foreign materials from being attached to a lower portion of the substrate, and may serve to buffer impacts from the outside.

The back plate 101 may be disposed adjacent to the bending area in other areas of the display panel 110 except for a bending area.

The back plate 101 may include a first back plate 101a and a second back plate 101b positioned on a rear surface of the first flat portion 110a and a rear surface of the second flat portion 110b, respectively. The first back plate 101a reinforces rigidity of the first flat portion 110a, so that the first flat portion 110a may be maintained in a flat state. The second back plate 101b reinforces rigidity of the second flat portion 110b, so that the second flat portion 110b may be maintained in a flat state. Meanwhile, to secure flexibility of the curved portion 110c and facilitate a control of a neutral surface using the micro-coating layer 145, it is preferable not to position the back plate 101 on a rear surface of the curved portion 110c.

The back plate 101 may be formed of a plastic thin film formed of polyimide (PI), polyethylene naphthalate (PEN), polyethylene terephthalate (PET), or combinations of these polymers.

A cushion tape 168 may be disposed on the rear surface of the first back plate 101a.

The cushion tape 168 may be attached to the rear surface of the first back plate 101a using an adhesive.

The adhesive may have an embossing pattern.

The adhesive may be composed of pressure sensitive adhesive (PSA).

The cushion tape 168 may be compressed when receiving external force to thereby absorb impacts.

The cushion tape 168 may include a heat radiation sheet on a rear surface thereof.

The heat radiation sheet may function to protect heat radiation, a ground, and the rear surface.

The heat radiation sheet may be composed of a composite heat radiation sheet.

Meanwhile, the micro-coating layer 145 may be disposed on the bending area of the display panel 110. The micro-coating layer 145 may be formed to cover one side of the barrier film.

Since tensile force is applied to the circuit wirings disposed on the display panel 110 when the display panel 110 is bent to thereby occur cracks in the wirings, the micro-coating layer 145 may serve to protect the wirings by coating resin with a small thickness at the bending position.

The micro-coating layer 145 may be formed of an acrylic material such as an acrylate polymer, but is not limited thereto.

The micro-coating layer 145 may adjust a neutral surface of the bending area.

As described above, the neutral surface may mean a virtual surface that is not stressed because compressive force and the tensile force applied to the structure cancel each other out when the structure is bent. When two or more structures are stacked, a virtual neutral surface may be formed between the structures. When the entirety of the structures are bent in one direction, the structures disposed in the bending direction with respect to the neutral surface are compressed by bending, and thus, are subjected to compressive force. On the contrary, the structures disposed in a direction opposite to the bending direction with respect to the neutral surface are stretched by bending and thus, are subjected to tensile force. In addition, since the structures are more vulnerable when subjected to tensile force among the same levels of compressive force and tensile force, the probability of crack occurrence is higher when they are subjected to tensile force.

The flexible substrate of the display panel 110 disposed under the neutral surface is compressed and thus, subjected to compressive force. The circuit wirings disposed above the neutral surface are subjected to tensile force and due to the tensile force, cracks may occur in the circuit wirings. Therefore, to minimize the tensile force to be received by the circuit wirings, the neutral surface may be positioned above the circuit wirings.

By disposing the micro-coating layer 145 on the bending area, the neutral surface may be raised upwardly and the neutral surface is formed at a position the same as that of the circuit wirings or the circuit wirings are located at a position higher than that of the neutral surface. Thus, the circuit wirings are not stressed or subjected to compressive force when bending, whereby the occurrence of cracks may be suppressed.

The circuit element 161 may be connected to an end portion of the second flat portion 110b of the display panel 110.

Various wirings for transmitting signals to the pixels disposed in the display area AA may be formed on the circuit element 161.

The circuit element 161 may be formed of a material having flexibility so that it is bendable.

A driver IC 165 may be mounted on the second flat portion 110b of the display panel 110 and be connected to the wirings formed on the circuit element 161 to thereby provide the sub-pixels disposed in the display area AA with driving signals and data.

The circuit element 161 may be a flexible printed circuit board (FPCB).

Meanwhile, to a portion of a rear surface of the cushion tape 168 according to an exemplary embodiment of the present disclosure, a functional tape 170 for adhesion between the cushion tape 168 and the second back plate 101b and for EMI shielding of the driver IC 165 may be attached.

As described above, an EMI shielding structure is required to block the effect of EMI on the driver IC 165. However, the prior art EMI shielding structures were disadvantageous in that position alignment is inaccurate due to the application of an additional EMI shielding sheet and costs of components and modules increase due to the duplicate use of an expensive material in the inaccurate alignment.

Accordingly, in the present disclosure, the functional tape 170 including an EMI shielding sheet 170b added between double-sided tapes 170a and 170c is used, whereby the adhesion between the cushion tape 168 and the second back plate 101b and the EMI shielding of the driver IC 165 may be simultaneously feasible.

The functional tape 170 according to an exemplary embodiment of the present disclosure includes a first double-sided tape 170a positioned on the rear surface of the cushion tape 168, a second double-sided tape 170c positioned on an upper surface of the second back plate 101b, and an EMI shielding sheet 170b interposed between the first and second double-sided tapes 170a and 170c. Thus, the functional tape 170 provides effects capable of improving an EMI shielding function with a low cost, together with an adhesive function, and deriving an optimum efficiency.

The functional tape 170 may be aligned with the driver IC 165 at a ratio of 1:1. To this end, the functional tape 170 according to an exemplary embodiment of the present disclosure may further include a quadrangular or bendable shape having a size equivalent to that of the driver IC 165.

As described above, the functional tape 170 according to an exemplary embodiment of the present disclosure may be formed such that the first and second double-sided tapes 170a and 170c adhere to upper and lower surfaces of the EMI shielding sheet 170b, respectively, and it may be patterned into a rectangular shape according to a shape of the display panel 110.

With reference to FIGS. 10A and 10B, particularly, the functional tape 170 according to an exemplary embodiment of the present disclosure is characterized by having an offset gap G between the first and second double-sided tapes 170a and 170c and the EMI shielding sheet 170b, thereby preventing interlayer separation in advance and securing structural stability. However, the present disclosure is not limited thereto, and there may be no offset gap between the first and second double-sided tapes 170a and 170c and the EMI shielding sheet 170b.

That is, sizes of the first and second double-sided tapes 170a and 170c and the EMI shielding sheet 170b are not the same as each other, and the size of the EMI shielding sheet 170b is smaller than those of the first and second double-sided tapes 170a and 170c.

Edges of the EMI shielding sheet 170b are internally retracted such that the EMI shielding sheet 170b has a size smaller than those of the first and second double-sided tapes 170a and 170c. Accordingly, a difference in the sizes of the first and second double-sided tapes 170a and 170c and the EMI shielding sheet 170b may be referred to as the offset gap G.

The offset gap G may have a range of about 0.5 mm to 1.5 mm to prevent interlayer separation between the first and second double-sided tapes 170a and 170c and the EMI shielding sheet 170b.

The offset gap G may be provided in four edges between the first and second double-sided tapes 170a and 170c and the EMI shielding sheet 170b, but is not limited thereto.

The functional tape 170 according to an exemplary embodiment of the present disclosure may be located at a position capable of covering the driver IC 165 to shield the EMI of the driver IC 165.

The driver IC 165 is disposed between the pad portion of the display panel 110, that is, the micro-coating layer 145, and the circuit element 161. One end portion of the functional tape 170 may overlap a portion of the micro-coating layer 145, and the other end portion thereof may be spaced apart from the circuit element 161 by a predetermined distance.

Meanwhile, the flexible display device of the present disclosure can shield EMI more effectively by additionally disposing a gasket tape on an upper surface of the driver IC, in addition to the functional tape. This will be described in detail through other embodiments of the present disclosure.

Figure 11:
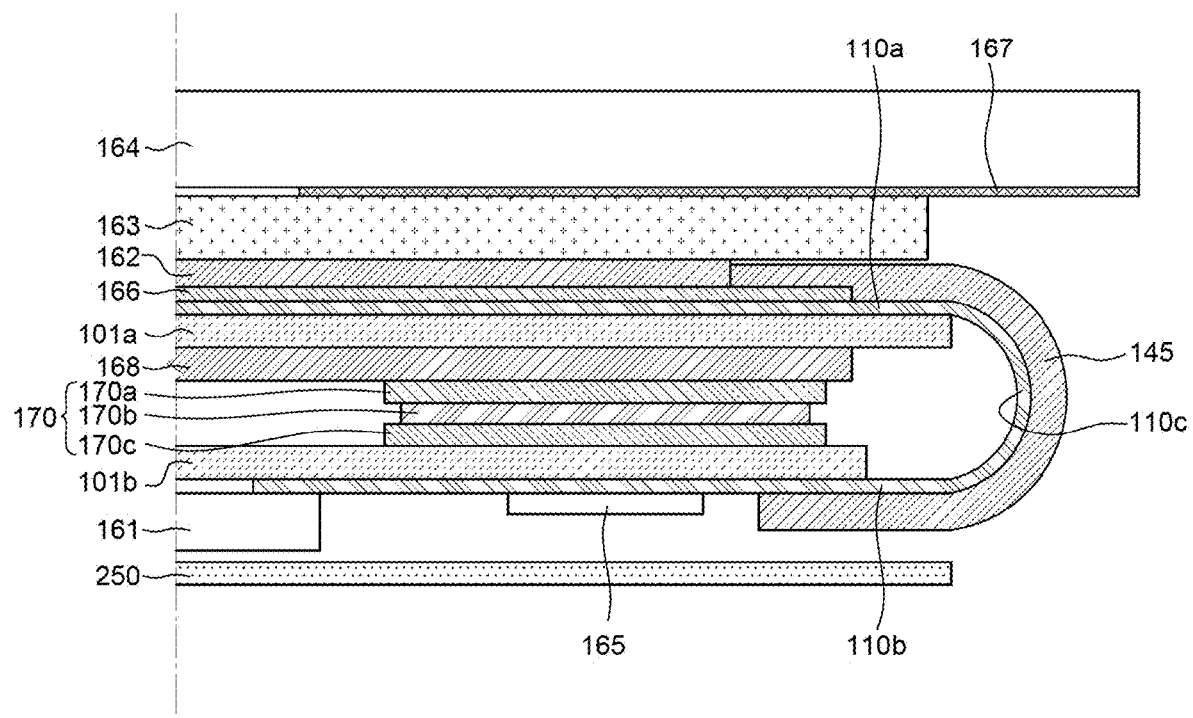
FIG. 11 is a cross-sectional view of a flexible display device according to another exemplary embodiment of the present disclosure.

FIG. 11 is a cross-sectional view of a flexible display device according to another exemplary embodiment of the present disclosure.

A flexible display device 200 according to another exemplary embodiment of the present disclosure, illustrated in FIG. 11 has substantially the same configuration as that of the flexible display device 100 of FIGS. 7 to 9, except that a gasket tape 250 is additionally disposed on the upper surface of the driver IC 165. The same reference numerals are used for the same configurations, and a redundant description will be omitted.

With reference to FIG. 11, the flexible display device 200 according to another exemplary embodiment of the present disclosure may include the display panel 110, the back plate 101, the polarizing plate 162, and the cover glass 164.

The barrier film may be disposed on the display panel 110.

The polarizing plate 162 may be disposed on the barrier film.

The touch panel 166 may be disposed between the polarizing plate 162 and the display panel 110.

The cover glass 164 may be attached to the polarizing plate 162 using the adhesive layer 163.

The light blocking pattern 167 may be disposed on four edges of the cover glass 164.

The back plate 101 may be disposed on the rear surface of the display panel 110.

The back plate 101 may include the first back plate 101a and the second back plate 101b positioned on the rear surface of the first flat portion 110a and the rear surface of the second flat portion 110b, respectively.

The cushion tape 168 may be disposed on the rear surface of the first back plate 101a.

The micro-coating layer 145 may be disposed on the bending area of the display panel 110.

The circuit element 161 may be connected to the end portion of the second flat portion 110b of the display panel 110.

The driver IC 165 may be mounted on the second flat portion 110b of the display panel 110.

To a portion of the rear surface of the cushion tape 168 according to another exemplary embodiment of the present disclosure, the functional tape 170 for adhesion between the cushion tape 168 and the second back plate 101b and for EMI shielding of the driver IC 165 may be attached.

The functional tape 170 according to another exemplary embodiment of the present disclosure may include the first double-sided tape 170a positioned on the rear surface of the cushion tape 168, the second double-sided tape 170c positioned on the upper surface of the second back plate 101b, and the EMI shielding sheet 170b interposed between the first and second double-sided tapes 170a and 170c.

The functional tape 170 may further include a quadrangular or bendable shape having a size equivalent to that of the driver IC 165.

The functional tape 170 according to another exemplary embodiment of the present disclosure may have an offset gap G between the first and second double-sided tapes 170a and 170c and the EMI shielding sheet 170b, but is not limited thereto.

The offset gap may have a range of about 0.5 mm to 1.5 mm to prevent interlayer separation between the first and second double-sided tapes 170a and 170c and the EMI shielding sheet 170b.

The offset gap may be provided in four edges between the first and second double-sided tapes 170a and 170c and the EMI shielding sheet 170b, but is not limited thereto.

The driver IC 165 is disposed between the pad portion of the display panel 110, that is, the micro-coating layer 145, and the circuit element 161. One end portion of the functional tape 170 may overlap a portion of the micro-coating layer 145, and the other end portion thereof may be spaced apart from the circuit element 161 by a predetermined distance.

The flexible display device 200 according to another exemplary embodiment of the present disclosure is characterized in that the gasket tape 250 is additionally disposed on the upper surface of the driver IC 165.

The gasket tape 250 may be attached to an upper surface of the circuit element 161 to cover the entirety of the driver IC 165 and one end of the micro-coating layer 145. The gasket tape 250 includes an EMI shielding sheet separately from the functional tape 170 to thereby effectively shield EMI.

For example, the gasket tape 250 may be composed of an adhesive layer and an EMI shielding sheet on the adhesive layer, and the EMI shielding sheet may have a thickness 10 times greater than that of the adhesive layer.

Meanwhile, as described above, the functional tape according to the exemplary embodiment of the present disclosure may not have an offset gap between the first and second double-sided tapes and the EMI shielding sheet. This will be described in detail through still another exemplary embodiment of the present disclosure.

Figure 12:
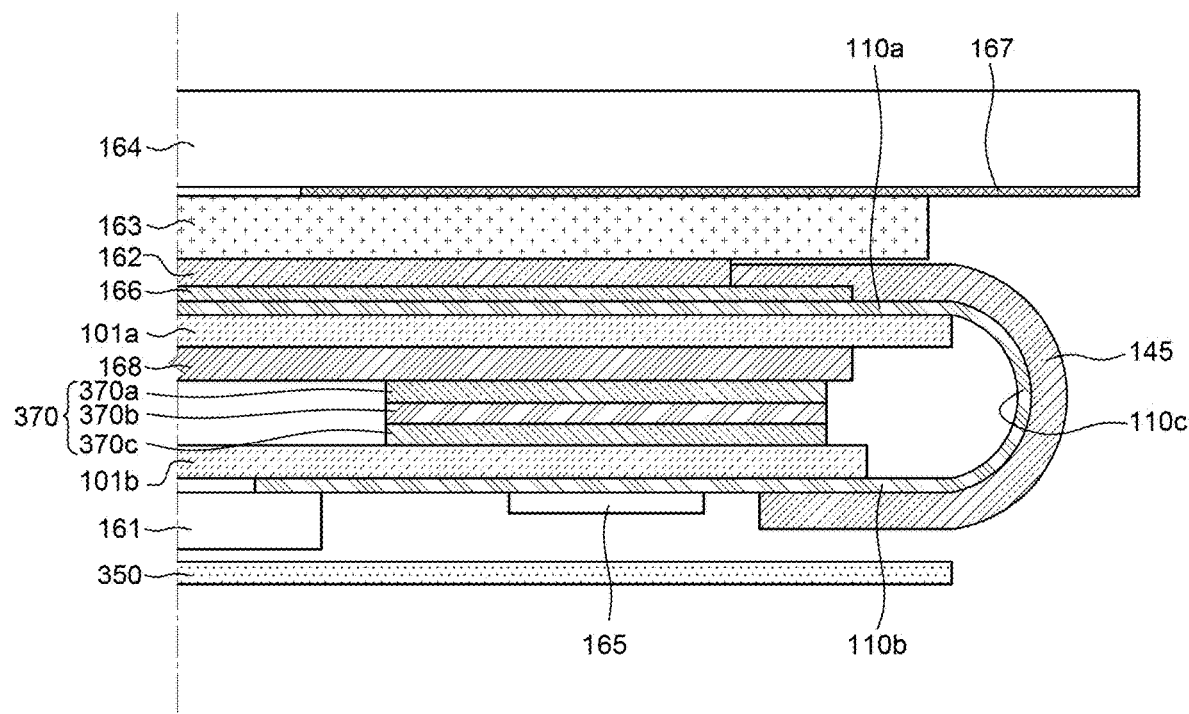
FIG. 12 is a cross-sectional view of a flexible display device according to still another exemplary embodiment of the present disclosure.

FIG. 12 is a cross-sectional view of a flexible display device according to still another exemplary embodiment of the present disclosure.

A flexible display device 300 according to still another exemplary embodiment of the present disclosure, illustrated in FIG. 12, has substantially the same configuration as that of the flexible display device 200 of FIG. 11 except for a structure of a functional tape 370. The same reference numerals are used for the same configurations, and a redundant description will be omitted.

With reference to FIG. 12, the flexible display device 300 according to still another exemplary embodiment of the present disclosure may include the display panel 110, the back plate 101, the polarizing plate 162, and the cover glass 164.

The barrier film may be disposed on the display panel 110.

The polarizing plate 162 may be disposed on the barrier film.

The touch panel 166 may be disposed between the polarizing plate 162 and the display panel 110.

The cover glass 164 may adhere to the polarizing plate 162 using the adhesive layer 163.

The light blocking pattern 167 may be disposed on four edges of the cover glass 164.

The back plate 101 may be disposed on the rear surface of the display panel 110.

The back plate 101 may include the first back plate 101a and the second back plate 101b positioned on the rear surface of the first flat portion 110a and the rear surface of the second flat portion 110b, respectively.

The cushion tape 168 may be disposed on the rear surface of the first back plate 101a.

The micro-coating layer 145 may be disposed on the bending area of the display panel 110.

The circuit element 161 may be connected to the end portion of the second flat portion 110b of the display panel 110.

The driver IC 165 may be mounted on the second flat portion 110b of the display panel 110.

To a portion of the rear surface of the cushion tape 168 according to still another exemplary embodiment of the present disclosure, the functional tape 370 for adhesion between the cushion tape 168 and the second back plate 101b and for EMI shielding of the driver IC 165 may be attached.

The functional tape 370 according to still another exemplary embodiment of the present disclosure may include a first double-sided tape 370a positioned on the rear surface of the cushion tape 168, a second double-sided tape 370c positioned on the upper surface of the second back plate 101b, and an EMI shielding sheet 370b interposed between the first and second double-sided tapes 370a and 370c.

The functional tape 370 may further include a quadrangular or bendable shape having a size equivalent to that of the driver IC 165.

The functional tape 370 according to still another exemplary embodiment of the present disclosure is characterized by not having an offset gap between the first and second double-sided tapes 370a and 370c and the EMI shielding sheet 370b. That is, the first and second double-sided tapes 370a and 370c and the EMI shielding sheet 370b may be configured to have substantially the same size.

The functional tape 370 according to still another exemplary embodiment of the present disclosure may be located at a position capable of covering the driver IC 165 to shield the EMI of the driver IC 165.

The driver IC 165 is disposed between the pad portion of the display panel 110, that is, the micro-coating layer 145, and the circuit element 161. One end portion of the functional tape 370 may overlap a portion of the micro-coating layer 145, and the other end portion thereof may be spaced apart from the circuit element 161 by a predetermined distance.

The flexible display device 300 according to still another exemplary embodiment of the present disclosure is characterized in that the gasket tape 350 is additionally disposed on the upper surface of the driver IC 165.

The gasket tape 350 may be attached to the upper surface of the circuit element 161 to cover the entirety of the driver IC 165 and one end of the micro-coating layer 145. The gasket tape 350 includes an EMI shielding sheet separately from the functional tape 370 to thereby effectively shield EMI.

For example, the gasket tape 350 may be composed of an adhesive layer and an EMI shielding sheet on the adhesive layer, and the EMI shielding sheet may have a thickness 10 times greater than that of the adhesive layer.

The exemplary embodiments of the present disclosure can also be described as follows:

A flexible display device according to an embodiment of the present disclosure comprises a display panel including a display area and a bending area extending from one side of the display area to be bent, a back plate disposed on a rear surface of the display panel, a cushion tape disposed on a rear surface of the back plate, a driver integrated circuit disposed in a pad portion extending from the bending area, and a functional tape adhered between the cushion tape and the back plate and disposed to face the driver integrated circuit.

The display panel may include, a first flat portion corresponding to the display area and maintained in a flat state, a second flat portion facing the first flat portion and including the pad portion, the second flat portion being maintained in a flat state, and a curve portion positioned between the first flat portion and the second flat portion and corresponding to the bending area.

The back plate may include, a first back plate positioned on a rear surface of the first flat portion, and a second back plate positioned on a rear surface of the second flat portion.

The cushion tape may be disposed on a rear surface of the first back plate.

The flexible display device may further comprise a micro-coating layer disposed on the bending area of the display panel.

The functional tape may provide adhesion between the cushion tape and the second back plate and shields electro-magnetic interference of the driver integrated circuit.

The functional tape may include, a first double-sided tape positioned on a rear surface of the cushion tape, a second double-sided tape positioned on an upper surface of the second back plate, and an electro-magnetic interference shielding sheet interposed between the first and second double-sided tapes.

The functional tape may have an offset gap between the first and second double-sided tapes and the electro-magnetic interference shielding sheet.

The offset gap may have a range of 0.5 mm to 1.5 mm.

The offset gap may be formed on four edges between the first and second double-sided tapes and the EMI shielding sheet.

The flexible display device may further comprise a circuit element connected to an end portion of the second flat portion.

The driver integrated circuit may be disposed between the micro-coating layer and the circuit element, wherein one end portion of the functional tape overlaps a portion of the micro-coating layer, and the other end portion of the functional tape is spaced apart from the circuit element by a predetermined distance.

The flexible display device may further comprise a gasket tape attached to an upper surface of the circuit element and covering one end of the micro-coating layer and the driver integrated circuit.

The gasket tape may include, an adhesive layer and an EMI shielding sheet provided on the adhesive layer.

A flexible display device according to another embodiment of the present disclosure comprises a display panel including a first flat portion, a second flat portion facing the first flat portion and including a pad portion, and a curved portion bent between the first flat portion and the second flat portion, a first back plate disposed on a rear surface of the first flat portion, a second back plate disposed on a rear surface of the second flat portion, a cushion tape disposed on a rear surface of the first back plate, a driver integrated circuit disposed on the pad portion, and a functional tape adhered between the cushion tape and the second back plate and disposed to face the driver integrated circuit to thereby shield electro-magnetic interference of the driver IC.

The functional tape may include, a first double-sided tape positioned on a rear surface of the cushion tape, a second double-sided tape positioned on an upper surface of the second back plate, and an electro-magnetic interference shielding sheet interposed between the first and second double-sided tapes.

The functional tape may have an offset gap between the first and second double-sided tapes and the electro-magnetic interference shielding sheet.

The flexible display device may further comprise a micro-coating layer disposed on the curved portion of the display panel and a circuit element connected to an end portion of the second flat portion.

The driver integrated circuit may be disposed between the micro-coating layer and the circuit element, wherein one end portion of the functional tape overlaps a portion of the micro-coating layer, and the other end portion of the functional tape is spaced apart from the circuit element by a predetermined distance.

The flexible display device may further comprise a gasket tape attached to an upper surface of the circuit element and covering one end of the micro-coating layer and the driver integrated circuit.

It will be apparent to those skilled in the art that various modifications and variations can be made in the flexible display device of the present disclosure without departing from the technical idea or scope of the disclosure. Thus, it is intended that the present disclosure cover the modifications and variations of this disclosure provided they come within the scope of the appended claims and their equivalents.

What is claimed is:
1. A flexible display device, comprising:
  a display panel including a display area and a bending area extending from one side of the display area to be bent;
  circuit wirings for supplying a gate signal and a data signal in a non-display area and passing the bending area;
  a cover glass over the display panel; and
  a light blocking pattern at an edge of the cover glass,
  wherein light blocking pattern overlaps at least a portion of the circuit wirings, and
  wherein the circuit wirings extend from the display area and are disposed in the bending area.

2. The flexible display device of claim 1, wherein the light blocking pattern is disposed on four edges of the cover glass.

3. The flexible display device of claim 2, wherein the light blocking pattern is disposed at edges of a rear surface of the cover glass.

4. The flexible display device of claim 1, further comprising:
  a polarizing plate on the display area; and
  an adhesive layer on the polarizing plate.

5. The flexible display device of claim 4, wherein the light blocking pattern is disposed to overlap the adhesive layer, the polarizing plate, and a portion of the display panel that are disposed under the light blocking pattern.

6. The flexible display device of claim 1, wherein the light blocking pattern is applied with black ink.

7. The flexible display device of claim 4, further comprising:
  a touch panel disposed between the polarizing plate and the display panel.

8. The flexible display device of claim 7, wherein the touch panel includes a plurality of touch sensors, and
  wherein the touch sensor includes at least one of a mutual capacitance sensor and a self-capacitance sensor.

9. The flexible display device of claim 1, wherein the circuit wirings are formed of a multilayer structure including various conductive materials.

10. The flexible display device of claim 1, wherein the portion of the circuit wirings disposed in the bending area are formed to extend in a diagonal direction, which is a direction different from a bending direction.

11. The flexible display device of claim 1, wherein the circuit wirings disposed in the bending area are formed in a shape such as a trapezoidal wave shape, a triangular wave shape, a sawtooth wave shape, a sinusoidal wave shape, an omega ($\Omega$) shape, or a rhombus shape.

12. A flexible display device, comprising:
a display panel including a display area and a bending area extending from one side of the display area to be bent;
circuit wirings for supplying a gate signal and a data signal in a non-display area and passing the bending area;
a cover glass over the display panel; and
a light blocking pattern at an edge of the cover glass,
wherein light blocking pattern overlaps at least a portion of the circuit wirings, and
wherein the circuit wirings are formed of a material such as a metal nano wire, metal mesh, or carbon nanotube (CNT).

13. A flexible display device, comprising:
a display panel including a display area and a bending area extending from one side of the display area to be bent;
circuit wirings for supplying a gate signal and a data signal in a non-display area and passing the bending area;
a cover glass over the display panel;
a light blocking pattern at an edge of the cover glass;
a back plate disposed on a rear surface of the display panel;
a cushion tape disposed on a rear surface of the back plate;
a driver integrated circuit (IC) disposed in a pad portion extending from the bending area; and
a functional tape adhered between the cushion tape and the back plate and disposed to face the driver IC,
wherein light blocking pattern overlaps at least a portion of the circuit wirings.

14. The flexible display device of claim 13, wherein the display panel comprises a first flat portion corresponding to the display area and maintained in a flat state, and a second flat portion facing the first flat portion and including the pad portion, the second flat portion being maintained in a flat state, and
wherein the back plate comprises a second back plate positioned on a rear surface of the second flat portion.

15. The flexible display device of claim 14, wherein the functional tape comprises a first double-sided tape positioned on a rear surface of the cushion tape, a second double-sided tape positioned on an upper surface of the second back plate, and an EMI shielding sheet interposed between the first and second double-sided tapes, and
wherein the functional tape has an offset gap between the first and second double-sided tapes and the EMI shielding sheet.

16. The flexible display device of claim 14, wherein the display panel further comprises:
a curve portion positioned between the first flat portion and the second flat portion and corresponding to the bending area.

17. The flexible display device of claim 16, wherein the back plate further comprises:
a first back plate positioned on a rear surface of the first flat portion.

18. The flexible display device of claim 17, wherein the cushion tape is disposed on a rear surface of the first back plate.

19. The flexible display device of claim 16, further comprising a micro-coating layer disposed on the curve portion of the display panel.

20. The flexible display device of claim 14, wherein the functional tape provides adhesion between the cushion tape and the second back plate and shields electro-magnetic interference (EMI) of the driver IC.

21. The flexible display device of claim 15, wherein the offset gap is formed on four edges between the first and second double-sided tapes and the EMI shielding sheet.

22. The flexible display device of claim 19, wherein the driver IC is disposed between the micro-coating layer and a circuit element, and
wherein one end portion of the functional tape overlaps a portion of the micro-coating layer, and the other end portion of the functional tape is spaced apart from the circuit element by a predetermined distance.

23. The flexible display device of claim 1, further comprising:
a thin film transistor in the display area and including a gate electrode, a source electrode, a drain electrode and a semiconductor layer; and
planarization layers over the thin film transistor including a first planarization layer and a second planarization layer that are sequentially stacked.

24. The flexible display device of claim 23, wherein the planarization layers are formed of one or more of acrylic resin, epoxy resin, phenolic resin, polyamides resin, polyimides resin, unsaturated polyesters resin, polyphenylene resin, polyphenylene sulfides resin, and Benzocyclobutene.

25. The flexible display device of claim 23, wherein the circuit wirings in the bending area include a first wiring under the first planarization layer and a second wiring under the second planarization layer.

26. The flexible display device of claim 9, wherein the circuit wirings are formed of the conductive materials having high ductility, including gold (Au), silver (Ag), or aluminum (Al).

27. The flexible display device of claim 9, wherein the circuit wirings are formed of molybdenum (Mo), chromium (Cr), titanium (Ti), nickel (Ni), neodymium (Nd), copper (Cu), or an alloy of silver (Ag) and magnesium (Mg).

28. The flexible display device of claim 25, further comprising:
a buffer layer under the first wiring and formed of an inorganic insulating layer.

* * * * *